US009413136B1

(12) United States Patent
Vethake et al.

(10) Patent No.: US 9,413,136 B1
(45) Date of Patent: Aug. 9, 2016

(54) STEPPED DIODE LASER MODULE WITH COOLING STRUCTURE

(71) Applicants: Thilo Vethake, Cranbury, NJ (US); Jeffrey Eisenmann, Howell, NJ (US); Stefan Heinemann, Hightstown, NJ (US)

(72) Inventors: Thilo Vethake, Cranbury, NJ (US); Jeffrey Eisenmann, Howell, NJ (US); Stefan Heinemann, Hightstown, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 0 days.

(21) Appl. No.: 14/794,254

(22) Filed: Jul. 8, 2015

(51) Int. Cl.
*H01S 5/024* (2006.01)

(52) U.S. Cl.
CPC ............. *H01S 5/02423* (2013.01); *H01S 5/024* (2013.01); *H01S 5/02407* (2013.01)

(58) Field of Classification Search
CPC .. H01S 5/024; H01S 5/02407; H01S 5/02423
See application file for complete search history.

(56) References Cited

U.S. PATENT DOCUMENTS

| | | | |
|---|---|---|---|
| 5,464,950 A | 11/1995 | Horiuchi et al. |
| 5,870,823 A | 2/1999 | Bezama et al. |
| 5,903,583 A | 5/1999 | Ullman et al. |
| 7,656,915 B2 | 2/2010 | Coleman et al. |
| 7,724,791 B2 | 5/2010 | Stephens |
| 7,751,458 B2 | 7/2010 | Regaard et al. |
| 8,130,807 B2 | 3/2012 | Schulz-Harder et al. |
| 8,345,720 B2 | 1/2013 | Stephens et al. |
| 8,432,945 B2 | 4/2013 | Faybishenko |
| 8,437,086 B2 | 5/2013 | Du et al. |
| 9,065,237 B2 | 6/2015 | Guo et al. |
| 2015/0131692 A1 | 5/2015 | Hayamizu et al. |

FOREIGN PATENT DOCUMENTS

EP        0811262 B1    5/2001

OTHER PUBLICATIONS

Nitriding of Aluminum Extrusion Die: Effect of Die Geometry by S.S. Akhtar, A.F.M. Arif, and B.S. Yilbas, Journal of Materials Engineering and Performance, vol. 199(3), Apr. 2010.
Diode laser modules based on laser-machined, multi-layer ceramic substrates with integrated water cooling and micro-optics by Alberto Campos Zatarain, Heriot-Watt University—School of Engineering and Physical Sciences, May 2012.

*Primary Examiner* — Armando Rodriguez
(74) *Attorney, Agent, or Firm* — Graham Curtin, P.A.

(57) ABSTRACT

A laser module has a unitary base including stepped platforms with an offset relative to an adjacent platform, each stepped platform accommodating a laser source with at least a first and a second plurality of stepped platforms, each platform accommodating a cooling channel inside at a predetermined depth below the top surface of the platform to conduct a flow of cooling fluid provided on an inlet, the cooling channel running under a platform having microchannels, the cooling channels being connected to a fluid inlet with an inlet manifold that provides cooling fluid at the inlet and an outlet manifold to dispose the cooling fluid with waste heat at an outlet, the laser module producing in one embodiment no less than 100 Watt of optical power.

18 Claims, 25 Drawing Sheets layer -3 layer -1

STEPPED DIODE LASER MODULE WITH COOLING STRUCTURE

BACKGROUND OF THE INVENTION

The present invention relates generally to multi-emitter laser modules with an integrated cooling system.

Single semiconductor lasers or emitters are compact and are widely used in a wide range of applications. In some applications an optical output power is required that is significantly greater than the output of a single emitter. One solution is to create a module with a plurality of single emitters and to combine the optical output of the individual single emitters into a combined optical output. The term single emitter is used herein. An example of a single emitter is for instance the L4 diode laser module by JDS Uniphase Corporation. However, a source of laser radiation can also be a stack or an array or bar of semiconductor lasers or a plurality of laser diodes. An example of a laser bar is the TruDiode 301 by Trumpf. Both the single emitter, which is a single laser diode and a stack or bar of laser diodes or a plurality of laser diodes will be considered herein to be a single laser source, unless specifically identified differently.

Multiple single laser sources can typically be assembled in a module such that the individual beams of the single sources are optically stacked in one axis to generate a single beam of laser radiation with a much higher optical power level than from the single laser source. There are different known ways to position individual laser sources in a module and combine the individual outputs into a more powerful combined optical output.

Edge emitting laser diodes are known in the art. For illustrative purposes a diagram of such a laser diode 100 is provided in FIG. 1. The diode contains multiple layers, including p and n layers and a radiating layer 101, generally with a long body and a smaller facing side. The layer 101, which may be called the active layer of a laser diode, includes the radiating part of interest of the device 100. The laser radiating part of active layer 101 is determined by factors such as top and bottom electrodes that provide electric current to activate the laser diode into emitting laser radiation. As an example, laser radiation may be emitted from at least part of the active layer 101 into the direction 112. Generally, the emitting apertures of a laser diode are rectangular shape with the long dimension having a size of typically tens to hundreds of microns, while the short dimension is typically one to two microns in size. Diffraction effects cause the emerging radiation to diverge, with the divergence angle being inversely proportional to the size of the aperture. The short dimension of the aperture is comparable to the typical laser diode wavelength of approximately eight hundred nanometers; diffraction effects result in large beam divergence in this, the "fast axis", direction typically between 40 to 60 degrees (90% power content.) The size of the divergence angle is known as the numerical aperture (NA), the beam having a lower numerical aperture along the direction of the stripe than perpendicular to the stripe. The long dimension of the stripe is known as the slow axis of the laser diode and typical divergence in this axis is in the range from 6 to 10 degrees. This divergence not only depends on the specific design of the diode laser, but also on the operating current for broad area diode lasers.

Collimating lenses are applied to collimate the radiation in the direction of the fast axis and optional the slow axis. For a laser diode bar comprising multiple emitting apertures in one device next to each other, a single lens or a microlens array may be used for collimating the beam in slow axis direction. In general, the fast axis collimators are placed directly or close to the output facet of the laser and may be cylindrical or toroidal in shape. At a further distance than the fast axis collimators, a slow axis collimator is applied to each laser source. Accordingly, the output beams of the individual laser sources are all collimated before being combined. The collimated individual source beams then have to be combined with an optical combiner into a single output beam, by for instance a lens, an optical multiplexer or by a polarizer.

In order to be able to properly collimate the individual beams and properly align the beams to enable combining, the individual laser sources have to be arranged and aligned with optics to keep individual beams separate and limit crosstalk and interference of individual beams before the combining step. For power scaling it is advantageous to limit the effects of heat dissipation by providing cooling capabilities to the individual laser sources and the combined unit or module. One way of cooling is by conductive cooling, wherein the generated heat is conducted through carriers and housings. In addition, one can increase cooling capabilities by providing a forced cooling by providing a flowing cooling medium through the carriers that support the laser sources. Furthermore, in many cases it is advantageous to have the powered laser sources being served by the same current, which can be achieved by arranging the laser sources in a serial network.

The related art provides several approaches to cooling laser modules. High power assemblies deploy mounting a single diode laser or diode laser bar on a heatsinks which may include channels. The heatsink is made typically from copper, ceramic or any combination thereof. Efficient heat transfer, matching the coefficient of thermal expansion to that one of GaAs diode, low electrical impedance and limited (electro-) corrosion are typical requirements. Diode coolers are disclosed in patents, such as U.S. Pat. No. 5,903,583, U.S. Pat. No. 8,345,720, U.S. Pat. No. 7,724,791, U.S. Pat. No. 8,130,807. One approach is illustrated in U.S. Pat. No. 5,870,823 issued on Feb. 16, 1999. This patent discloses a sintered ceramic substrate that includes at least one cooling channel that is internal to the ceramic body. Another approach to cooling a ceramic substrate that hosts a laser source is described in Diode laser modules based on laser-machined, multi-layer ceramic substrates with integrated water cooling and micro-optics, by Alberto Campos Zatarain, May 2012.

However, none of these references describe an effective approach to cooling a multi-emitter stepped module with platforms, as disclosed herein. For cost effective manufacturing, preferably each platform hosts optics, like a mirror, lens and, of course, a laser source. The platforms are stepped relatively to each other and relative to a base plane of a module to allow for effective optical stacking or beam combining of the individual laser diodes or laser sources. The prior art does not teach or suggest an effective structure or method to cool a laser diode assembly having a stepped, preferably unitary, ceramic base.

Accordingly, improved and novel multi laser emitter stepped modules with an effective integrated cooling architecture embodied in a single body are required.

SUMMARY OF THE INVENTION

The present invention generally provides an apparatus and a method for providing a multi-emitter stepped laser module with an integrated cooling architecture, an integrated current path for electrically connecting the individual laser diodes and mechanical housing. Preferably, such a laser module has a single ceramic body including a single integrated or unitary base.

In accordance with an aspect of the present invention a laser module body is provided to be cooled with cooling fluid the laser module body having a first and a second electrode, comprising a unitary ceramic base having a bottom, a plurality of platforms formed in the unitary ceramic base, each one of the plurality of platforms having a width, a length and a height relative to a base plane parallel to the platforms and forming a stepped structure, each platform having a different height relative to the base plane, each platform having a top surface being enabled to hold a laser source and at least one optical component at defined locations on a top surface of the platform, each one of the plurality of ceramic platforms containing a cooling channel running internally along at least part of its length from a first end to a second end at a defined depth under the top surface at least under the defined locations, wherein the cooling channels in the platforms are spatially separated from each other, a fluid inlet and an input manifold connecting the fluid inlet to the first end of each of the cooling channels of the plurality of ceramic platforms to distribute the cooling fluid and an output manifold connecting the cooling channels from the second end of each of the cooling channels in the plurality of platforms to a fluid outlet that disperses the cooling fluid from the laser module body.

In accordance with a further aspect of the present invention, a laser module body is provided, wherein the platforms are substantially parallel to each other.

In accordance with yet a further aspect of the present invention, a laser module body is provided, wherein each platform is provided with a conducting layer and/or a metallization layer.

In accordance with yet a further aspect of the present invention, a laser module body is provided, wherein the microchannels are located underneath the laser source on at least one of the plurality of platforms.

In accordance with yet a further aspect of the present invention, a laser module body is provided, wherein there are at least two platforms.

In accordance with yet a further aspect of the present invention, a laser module body is provided, further comprising a first and second receiving opening to receive the first and second electrodes.

In accordance with yet a further aspect of the present invention, a laser module body is provided, wherein the laser module body has a radiation output to provide stacked radiation beams generated by laser sources hosted on the plurality of platforms.

In accordance with yet a further aspect of the present invention, a laser module body is provided, wherein the plurality of platforms includes a first and a second plurality of platforms, the first plurality of platforms having a sloping direction different from the second plurality of platforms.

In accordance with yet a further aspect of the present invention, a laser module body is provided, wherein the plurality of platforms includes a first and a second plurality of platforms, the first plurality of platforms having the same sloping direction as the second plurality of platforms.

In accordance with another aspect of the present invention, a method is provided for cooling a laser module body having a first and a second electrode and a plurality of laser sources, with a cooling fluid, providing the cooling fluid on an inlet of the laser module body, the laser module being a single body of ceramic material, distributing the cooling fluid through an input manifold connected to the inlet to a first end of each of a plurality of cooling channels, each of the cooling channels being embedded at a predefined depth in a corresponding ceramic platform in a plurality of ceramic platforms in the single body, the ceramic platforms being substantially parallel to each other, each one of the plurality of ceramic platforms having a height relative to a base plane of the single body parallel to the ceramic platforms to form a stepped structure, each cooling channel inside a ceramic platform running from the first end of the ceramic platform to a second end of the ceramic platform, each ceramic platform having a different height relative to each other measured to the base plane, a top surface of each ceramic platform supporting one of the plurality of laser sources and at least one optical component at defined locations, the cooling channels in the ceramic platforms being spatially separated from each other, each ceramic platform being adapted to host a laser source and receiving, with an output manifold, cooling fluid exiting the cooling channels from the second end and disposing the cooling fluid on an outlet connected to the output manifold.

In accordance with yet another aspect of the present invention, a method is provided for cooling a laser module body, further comprising: the cooling fluid passing through a plurality of microchannels in the cooling channel of each of the plurality of ceramic platforms and removing heat generated by the laser source on the at least one of the plurality of ceramic platforms.

In accordance with yet another aspect of the present invention, a method is provided for cooling a laser module body, wherein the microchannels are located underneath the laser source.

In accordance with yet another aspect of the present invention, a method is provided for cooling a laser module body, wherein there are at least two ceramic platforms.

In accordance with yet another aspect of the present invention, a method is provided for cooling a laser module body, wherein the plurality of ceramic platforms includes a first and a second plurality of ceramic platforms, the first plurality of ceramic platforms having a sloping direction that is different from the second plurality of ceramic platforms.

In accordance with yet another aspect of the present invention, a method is provided for cooling a laser module body, wherein the plurality of ceramic platforms includes a first and a second plurality of ceramic platforms, the first plurality of ceramic platforms having a same sloping direction as the second plurality of ceramic platforms.

In accordance with yet another aspect of the present invention, a method is provided for cooling a laser module body, further comprising: outputting stacked radiation beams generated by laser sources hosted on the plurality of platforms.

In accordance with yet another aspect of the present invention, a method is provided for cooling a laser module body, wherein the cooling channels are an integrated part of the single body that are formed during manufacturing of the single body.

In accordance with yet another aspect of the present invention the stepped base with integrated cooling, metallization layers and electrical conducting layers is formed and manufactures such that it can be closed and sealed (optionally hermetically sealed) with a single lid that may be formed as a plate or as a dimensional part.

DETAILED DESCRIPTION

One aspect of the present invention is directed to a stepped diode laser module adapting multiple laser sources arranged for optical stacking made from ceramics with integrated cooling channels for efficient heat dissipation form the individual laser sources, integrated metallization pads for adapting the individual laser sources via soldering, integrated current conducting layers and integrated mounting pads for beam shaping and beam direction optics. A coolant, such as non-deionized water, flows through the cooling structures, allowing the laser module to have a lower component count and improved power density.

Figure 1:
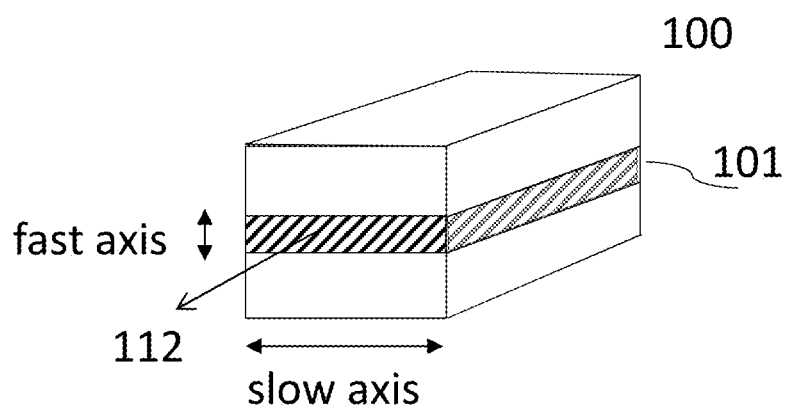
FIG. 1 illustrates in diagram a structure of a laser diode.
Figure 2:
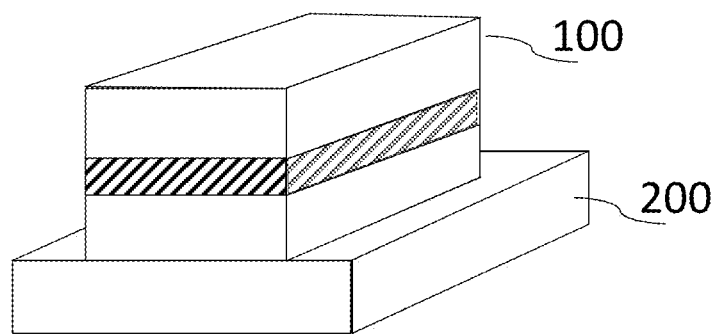
FIG. 2 illustrates in a diagram the structure of a laser diode mounted to a submount.

A laser diode 100 is shown in FIG. 1 and on a submount 200 that is typically larger than the laser diode in FIG. 2.

Figure 3:
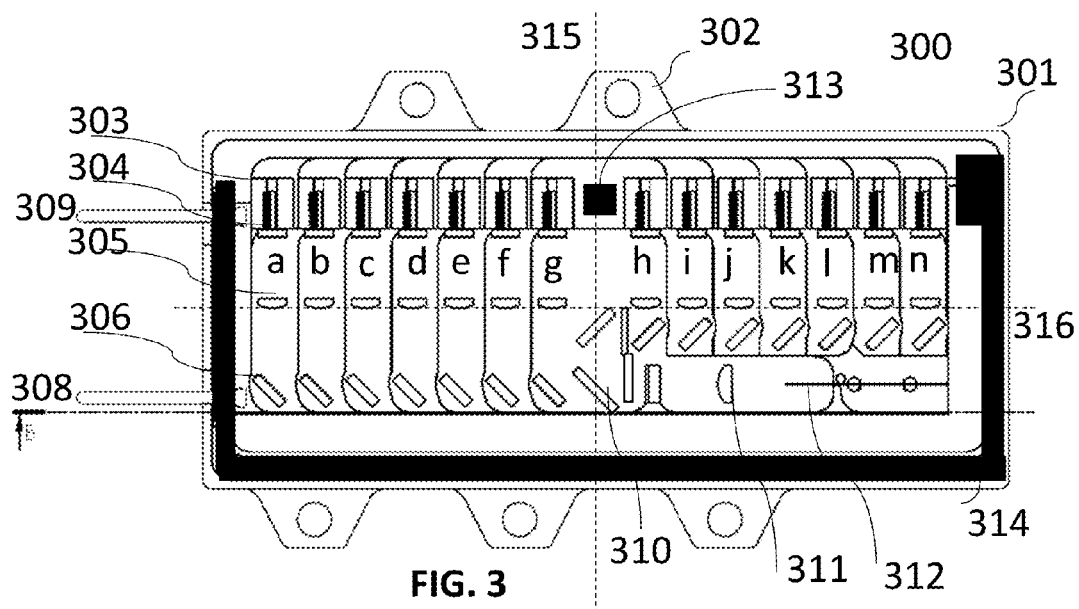
FIGS. 3, 4, 5, 6, 7, 8 and 9 illustrate various aspects of a laser module in accordance with an aspect of the present invention.
Figure 4:
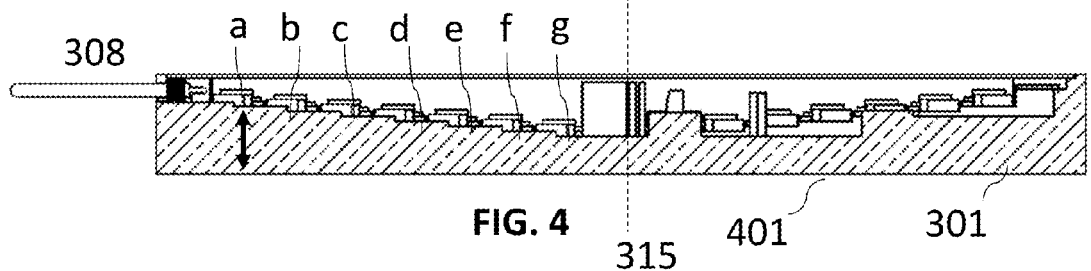
Figure 5:
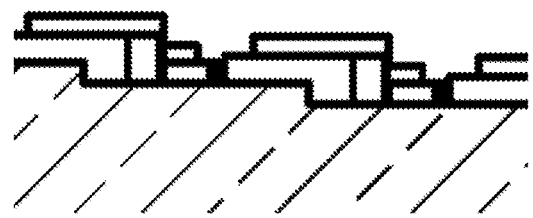

One embodiment of a multi-single-emitter module in accordance with an aspect of the present invention is illustrated in FIGS. 3, 4 and 5. The diagrams of FIGS. 3-5 show the stepped or staggered lay-out of the module, which allows beam shaping and optical stacking of the individual laser diodes to result in a compact output beam FIG. 3 is a top view of a module 300. The module 300 has an integrated body 301, including the outside or frame of the body, including integrated flanges and connecting holes 302. The inside of the module contains the stepped structure, with steps or platforms a, b, c, d, e, f and bottom g at the left side of the top view. Other stepped platforms, as shown in the figures, are provided on the right side. A cross section of the module 300 is shown in FIG. 4 and should be advantageously considered and viewed in combination with FIG. 3 to explain its construction.

FIG. 4 illustrates a cross section of FIG. 3 and shows that body 301 is a one piece body that is machined of a single piece of metal or is created as a single body of ceramics. In a preferred embodiment, it is ceramic. In another embodiment of the present invention, the body is formed from multiple layers of metal, in which features are machined, or drilled or created in any effective manner and the metal layers with the required features are fixedly combined into a single body. In a further embodiment of the present invention, the body 301 is completely made of ceramic or a mixture of ceramic and metal. This can be done, for instance, by creating different layers of ceramic material with features being cut out from each layers or otherwise formed and all ceramic layers being stacked in an aligned way and kilned in a furnace or oven to create a single body 301. One advantage of the ceramic embodiment over the machined metal is a significant reduction in cost. Other advantages of the ceramic of the ceramic housing over the metallic housing is the electrical insulation and thus elimination of electro-corrosion as well as the hardness of ceramic allowing faster coolant flow and thus improved cooling without corrosion of the cooling structure. Furthermore, the thermal conductivity of AN and BeO is very good and their thermal expansion is similar to gallium arsenide, a common material for high power laser diodes.

The laser module as provided in accordance with an aspect of the present invention has as a single subunit in a single plane, comprising a single laser diode on a submount 303 powered by an electric current and radiating through a fast axis collimator 304 and a slow axis collimator 305 onto a reflector 306. All components are located on a step or platform a in the body. The step a has a predefined height relative to the base level g or the bottom level 401 of the body. The body 301 that has the base level and the stepped platform, in its totality is called the base. The base is provided with walls and attachment flanges like 302 that in its totality is named the body of the laser module. In this example, the left side of the module has 7 different steps down or platforms a, b, c, d, e, f and g going down from left to right from a highest, unmarked level to lowest level g. Each step, or platform has its own emitter, fast and slow collimators and reflector. The step height between individual modules is determined by the height of the collimated beam in fast axis direction to allow optical stacking of individual laser diodes with high optical fill factor. Thus, radiation emitted from individual emitter 303 will pass through collimators 304 and 305 to hit and being reflected by reflector 306 into the direction along an optical axis towards combining optics 310 located on level or platform g. The combining optics 310 in one embodiment of the present invention is a plate or prism with polarizing coating; in another embodiment it can be a dichroic reflector to combine laser radiation with different wavelength.

Platform b is stepped down from level or platform a. The emitter, collimators and reflector associated with platform b are located below those of platform a, relative to level g or base level 401. The reflector associated with platform b reflects the radiation of emitter associated with platform b to the combining optics 310. Optional, a focusing lens 311 focuses the individual beams on a receiving optical fiber 312. Because of the level difference between platforms a and b the radiation of the related emitters are parallel along an axis towards 310 but not interfering with each other, as the optical axis of the two beams are at different levels. The emitters and optics on platforms c, d, e, f and g operate in a similar manner in a non-interfering way. The driving electric current is guided through connectors 308 and 309. An opening in the body 301 is applied for outputting the radiation through. The individual laser diodes are electrically connected in series via wire bonds or other state of the art electrical connectors.

The module 300 has a similar arrangement preferably in a mirror set-up on the right side of the module. This is illustrated as platforms i, j, k, l, m and n in FIG. 3 and in FIG. 4 which shows a cross-sectional view of the module through the rear portion of the module. Details of an emitter are shown in FIG. 5. The laser diode is bonded onto a ceramic submount, which is then soldered onto the module base at a specific level. The top surface of the submount is separated into two metalized regions, forming positive and negative contact for the laser. Wirebonds are used to connect the top of the laser diode (usually the N-side) to the negative contact area of the submount. Fast-axis collimator lenses are usually attached very close to the front facet of the laser due to the very small back focal length It is not required that the right side of the module is exactly mirrored and in one embodiment of the current invention the steps on the left and the right side of the module are not exactly mirrored and are not on the same level. The mirroring of the left side of the module onto the right side takes place roughly around a virtual line 315 which is shown in FIGS. 3 and 4.

In the illustrative embodiment shown in FIG. 3, the steps a, b, c, d, e and f, and steps i, j, k, l, m and n have a slope in opposing directions.

Electrical connections between the laser diode groups are made via wire bonding or other state of the art electrical connectors to a current duct 313 integrated on the base of the module on level g, respectively h. The laser diode on level a is electrically connected to connector 309 and the laser diode on level n is connected to current duct 314, which is electrically connected to connector 308.

Figure 6:
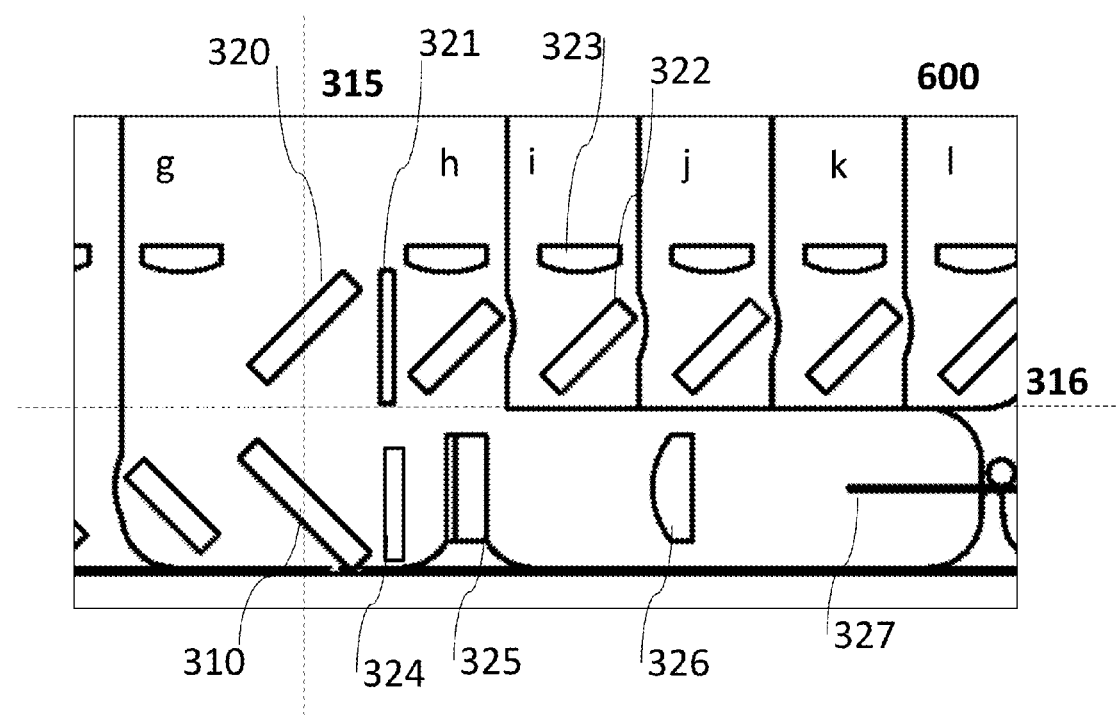

A detailed illustration of the area 600 around combiner 310, which may be a polarization combiner, is provided in FIG. 6. Other combiners such as wavelength multiplexers are also contemplated. The area to the right of line 315 and above line 316 is a mirror copy of the left side of module. It has the steps or platforms h, i, j, k, l, m and n. Step or level h is the same level as platform or level g. Each of the platforms h, i, j, k, l, m and n has a laser source, which may be a single laser emitter, and a fast axis collimator (both not shown in FIG. 6) a slow axis collimator 323 and a reflector 322. To prevent FIG. 3 to become too crowded with numerals, some elements are not identified in FIG. 3, which are now identified in FIG. 6. These include cylindrical focusing lenses 325, and 326 to focus the combined beam into the output fiber 327. Furthermore, an optional Bragg grating 324 can be placed between the combining polarizer 310 and the cylindrical lens 325. The optional Bragg grating 324 is applied to stabilize the wavelength of the combined laser radiation.

Also identified in FIG. 6 is a half-wave plate 321 for the output beams of the laser sources on platforms or steps h, i, j, k, l, m and n in this illustrative example. The output beams of the emitters are reflected by a reflector 320 to the combining polarizer 310 and combined with the output of the emitters on the left side of the module. The individually collimated emitter or laser source beams from each side of the module are radiated along a common axis on the left side but separated by the stepped or staggered location of the sources and optics each side forming two densely stacked optical bundles, one from each side, which are combined in the combining polarizer 310. The space required for the reflector 320 and the combining polarizer 310 adds to the additional depth or width of the module beyond what would be required for a single row of stepped platforms with laser sources or emitters.

The specific arrangement of the optical elements for dense optical stacking and the associated step height between individual platforms is specifically described for the module shown in FIG. 3. Other step heights and optics maybe used resulting in varying optical fill factors and beam dimensions. Furthermore the beam combining and focusing optics may also be different. For example the module may be designed in such a way that the beams from the left side of the module are optically interleaved with the beams of the right side or the beams of the left side are optically stacked on top of the beams from the right side. In both cases no polarization combiner and no waveplate are used. Also the focusing optic and fiber coupling are optional. Furthermore the lens for slow axis collimation may also be removed, mainly for the reason of cost savings.

The herein provided configuration of a laser module of at least 2 rows of stepped or staggered emitters or laser sources provides an unexpected extra benefit of creating room for the output optics or other output structures, such as a fiber couple section.

Figure 7:
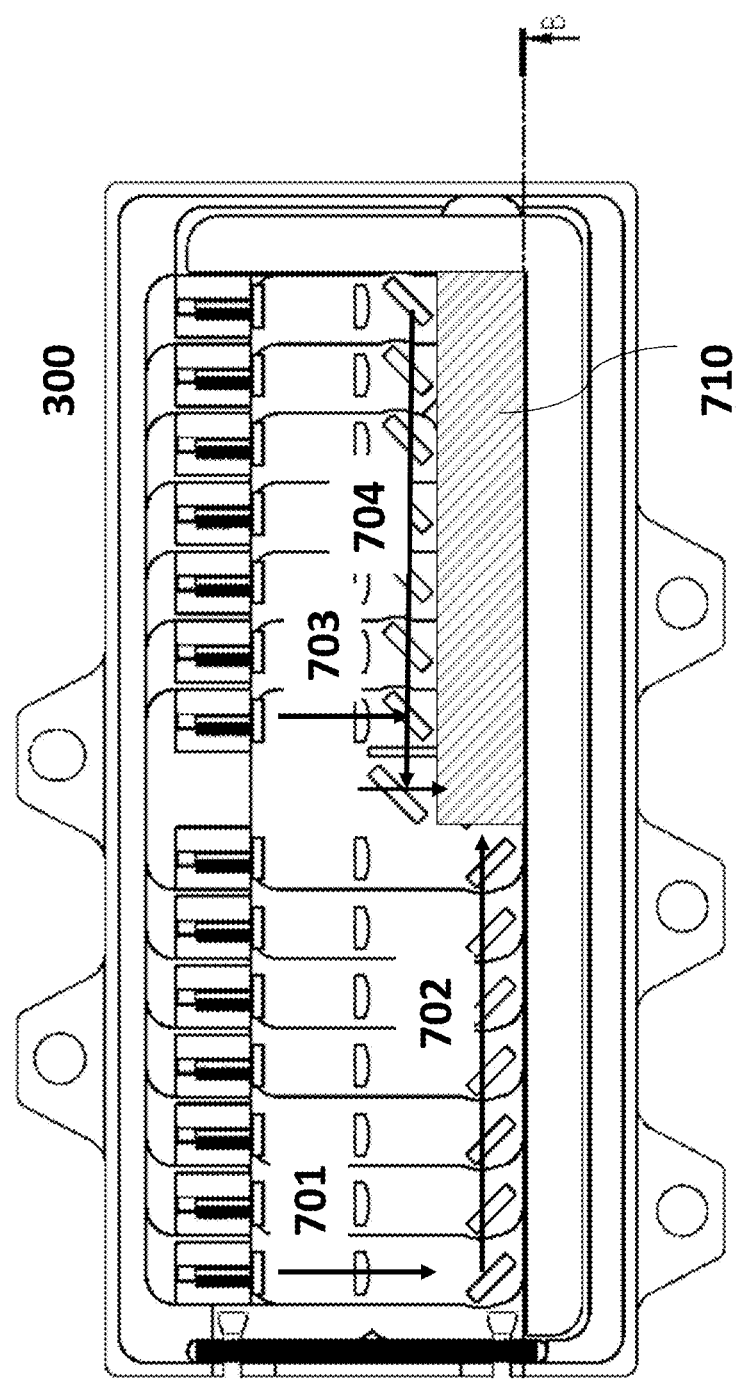

The required minimum distance between each emitter or laser source and slow axis collimator 323 determines the width of the module. It is not desirable that radiation from individual emitters overlap each other and that radiation on one side of the module interferes with the radiation generated on another side of the module. Interference of radiation from individual emitters is prevented by using the stepped or staggered platforms. This is again illustrated in FIG. 7. Arrows 701 and 703 are exemplary indications of the axes and direction of the collimated radiation of the individual emitters. The radiation of the laser sources is parallel and in different planes, due to the platforms and the collimation and is pointed to the right in the module 700. The individual slow axis collimators are placed in the same plane as the laser diode or on a common platform, dictated by optical considerations. The individual beams are reflected by individual reflectors mounted at the same platform as their respective laser diode towards a combiner with (on right side of module) or without use (on left side of the module) of a common reflector. The common directions of the reflected individual beams are indicated by arrow 702 for the left side of the module and arrow 704 for the right side of the module.

To prevent interference or cross-talk from the beams along arrows 702 and 704, these combined beams are placed in different planes, so the beams along arrow 704 cannot hit or reflect on any of the reflectors of combined beam along 702. This is achieved in this illustrative case by placing the row of reflectors of the right side of the module along the arrow 704 closer to the row of slow axis collimators than on the left side, which is clearly shown, though not necessarily in correct scale, in FIG. 7. The specific arrangement of the individual beams, beam shaping, beam redirection and beam combining optics as well as the advantages resulting therefrom are described in U.S. patent application Ser. No. 14/602,418 by Li et al. filed on Jan. 22, 2015 which is incorporated herein by reference.

Figure 24:
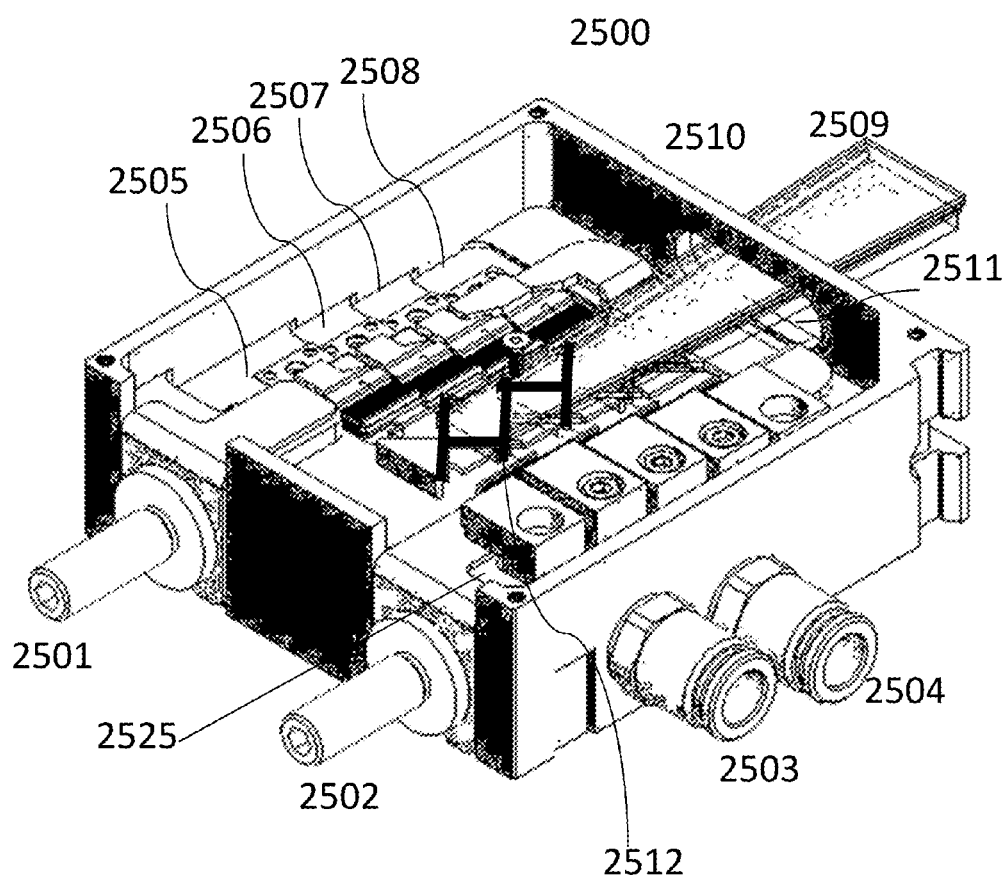
FIG. 24 illustrates another embodiment of the present invention.

Different architectures and realizations of stepped platform laser modules are possible and are fully contemplated. Another stepped platform multiple laser source module design is illustrated in FIG. 24 and described later below herein. This and other stepped platform designs in accordance with one or more aspects of the present invention are also provided with the cooling channels through the stepped platforms as provided herein.

Aspects of this invention further pertain to a cost effective housing with integrated heatsink for single emitter modules resulting in a staircase like arrangement of the single emitters optimized for optical stacking of the radiation. Water cooling for the individual single emitters is integrated in the housing for highest power and the coolant is electrically insulated from the single emitters. The housing with integrated water cooling is made from multiple layers, either all electrically insulating (i.e. ceramics) or all electrically conductive (i.e. copper), or a combination thereof. A conductively cooled, state of the art heatsink is machined from bulk material with high thermal conductivity, i.e. Cu, but, in accordance with the present invention, can be made in totality and partially from ceramic material. It is to be understood that also multi emitter diode lasers and bars can be used instead of single emitters in such an arrangement. It is further to be understood that the housing may be made out of two properly structured parts, preferably made from ceramics, that form a similar or identical arrangement of integrated channels as the multilayer assembly.

The p-side of single-emitter diode laser chips with typical dimensions of 0.6 mm (W)×0.1 mm (H)×4 mm (L), is bonded to a submount and the N-side is wire bonded. The submounts can be either electrically conductive (CuW for example) or electrically insolating (BeO or AlN for example) but with a structured metallized surface. One partition is coated with solder for soldering on the single emitter, while the other partitions are prepared for wire bonding to connect neighboring devices electrically in series. The laser diodes are electrically connected in series by wire bonds routed to the neighboring submount, Lead frames or other known methods may be used to electrically connect the individual laser diodes on submounts in series.

The submounts with diodes are subsequently mounted to the main heatsink. For electrical isolation, the heatsink is made from an isolating material, such as ceramics (i.e. AlN or BeO), if conductive submounts are used or can be made from a conductive material, preferably Cu, if an isolating submount is used. The heatsink is formed such that at least one row of diode lasers that are aligned to each other such that the light emitting facets of the single emitters are all in one plane perpendicular to the optical axis and are displaced to each other in fast axis by a distance at least equal or similar to the collimated beam height as well as in slow axis by a distance determined at least by the dimensions of the submount, minimum thermal cross talk and non-overlapping beams prior to collimation in the second (slow) axis.

In accordance with an aspect of the present invention, water cooling is introduced for improved cooling, higher output power and increased reliability of the diode laser module. In this case, the staircase-like heatsink is made from individual layers comprising features for coolant flow on one side and mounting the diode laser on the opposing side. each layer having a thickness equal or close to equal to the fast axis collimated beam height. Except for the outer cover layers, each layer has a structure for coolant flow, preferably small channels, machined or otherwise created by shaping features into material layers in such a way that coolant can flow from one platform to one or more of the next subsequent platforms.

Features, even extremely small features, can be formed in different materials or in layers of materials, such as metals or ceramics and green, un-sintered or un-kilned, layers of ceramic materials. Known micro-forming technologies include micro-machining, micro-molding and micro-stamping which can create features with high precision and dimensions of 1 mm and lower, as would be known to one of ordinary skill in micro-forming.

The layers are subsequently joined to each other by diffusion bonding (for Cu) or kilning (for ceramic), or brazing or soldering or any other method known the a person skilled in the art. Alternative design and manufacturing methods include (micro-) molding, precision machining or similar methods of two half to create the integrated cooling channels after the two halves are bonded together.

Figure 9:
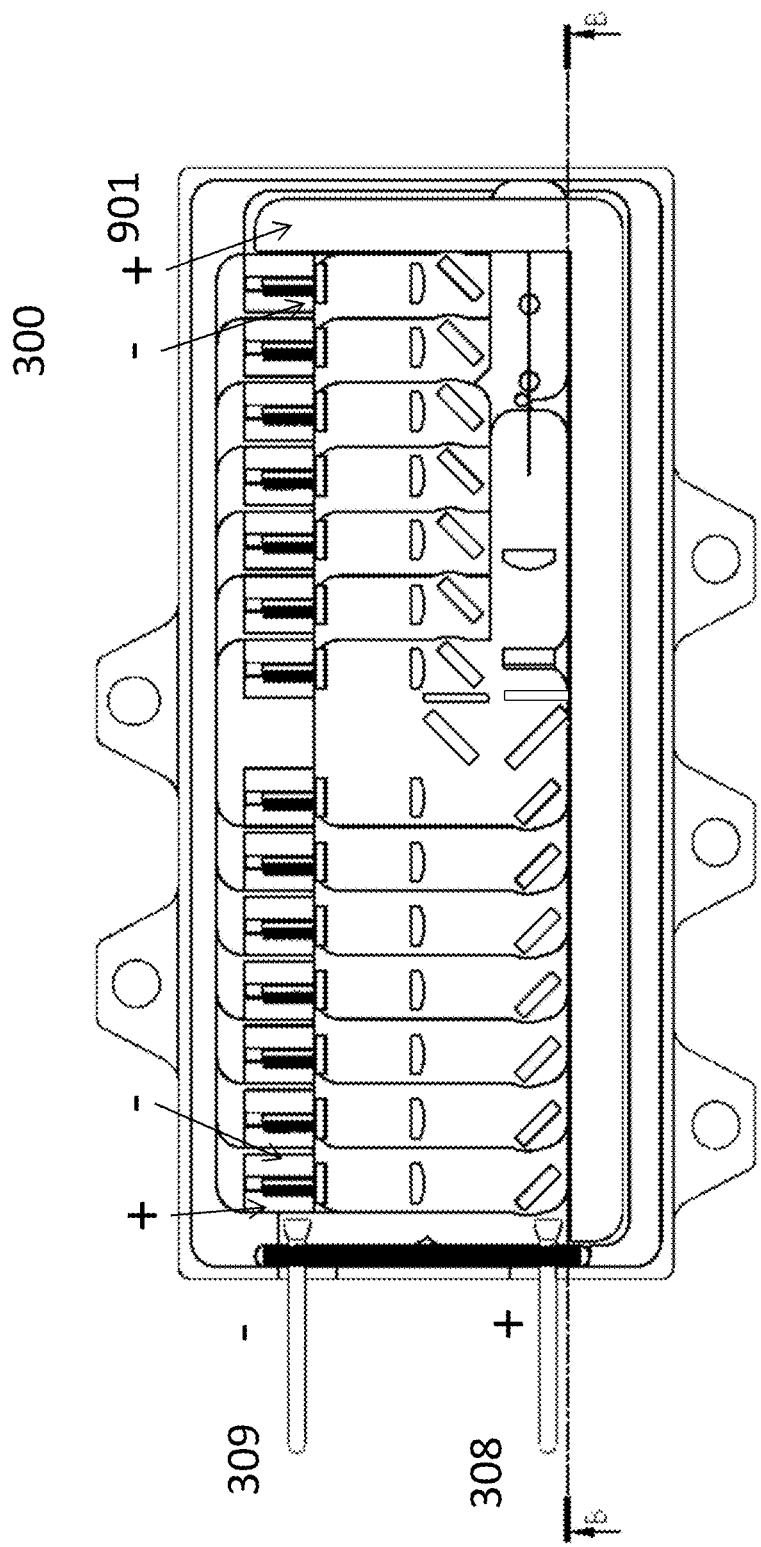

Thereafter an interface for bonding the diode on a submount to the heatsink, preferably a metallization suitable for soldering, is deposited on each cooled area. Subsequently, the diodes on submount are mounted to the heatsink, preferably using a reflow process and then wire bonded resulting in serial connection of all single emitters. This is illustrated in FIG. 9.

Elements 309 and 308 are the negative and positive electrode on the module 300 for external power. The '+' and '−' symbols illustrate the galvanic connection between some of the elements. Not all connections are identified in the figure, as to prevent cluttering of the illustrative example. A metallization layer 901 that acts as a positive electrode is shown in FIG. 9.

The diode maybe directly bonded to the heatsink, if the heatsink is made out of electrical isolating material. This set-up minimizes the thermal impedance, allowing highest output power and minimizes the number of manufacturing sequences thus resulting in lowest manufacturing costs. However, a serial or batch soldering process is required and the diodes cannot be fully tested prior to assembly of the module. Also the metallization on the individual platforms must be structured in two (2) segments, one for soldering the laser diode and one for wire bonding to the subsequent laser diode.

The individual layers, and at least a top layer or the top of a machined body, may also include features for alignment of the single emitter on submount to reference submount location as well as features for attaching the fast axis collimation lens.

Bus bars for current routing maybe integrated on the outer cover layers to connect the main current connectors of the module to the first and the last single emitter on submount. In case of an electrically conductive heatsink the bus bars are insulated from the heatsink by a separate layer of isolating material, such as pyralux or Kapton foil. If the heatsink is made from electrically isolating material, e.g. ceramic, the bus bars are directly deposited on the heatsink e.g. via plating or sputtering. It would be apparent to a person skilled in the art that any arbitrary current routing can be deployed.

The optical radiation of the individual single emitters of one row are each first collimated in fast axis resulting in a typical beam height (x axis) of 0.5 mm and subsequently collimated in slow axis (y axis) to result in a typical beam width of 1 mm. The individual, collimated beams are then optically stacked in fast axis (x axis) by bending mirrors or reflectors redirecting the beam by preferably 90 degrees. in the z-y plane. In one embodiment of the present invention the module has 2 rows of stacked single emitters arranged in one housing that are optically combined into one beam by polarization or wavelength multiplexing. It would be apparent to a person skilled in the art that other arrangements are possible, such as more than 2 rows of emitters and an arbitrary number of emitters in each row as well as an optical arrangement with interleaving beam paths of individual rows. Also aspects of the present invention are not limited to single emitters, but can comprise bars or mini-bars of laser diodes.

Figure 8:
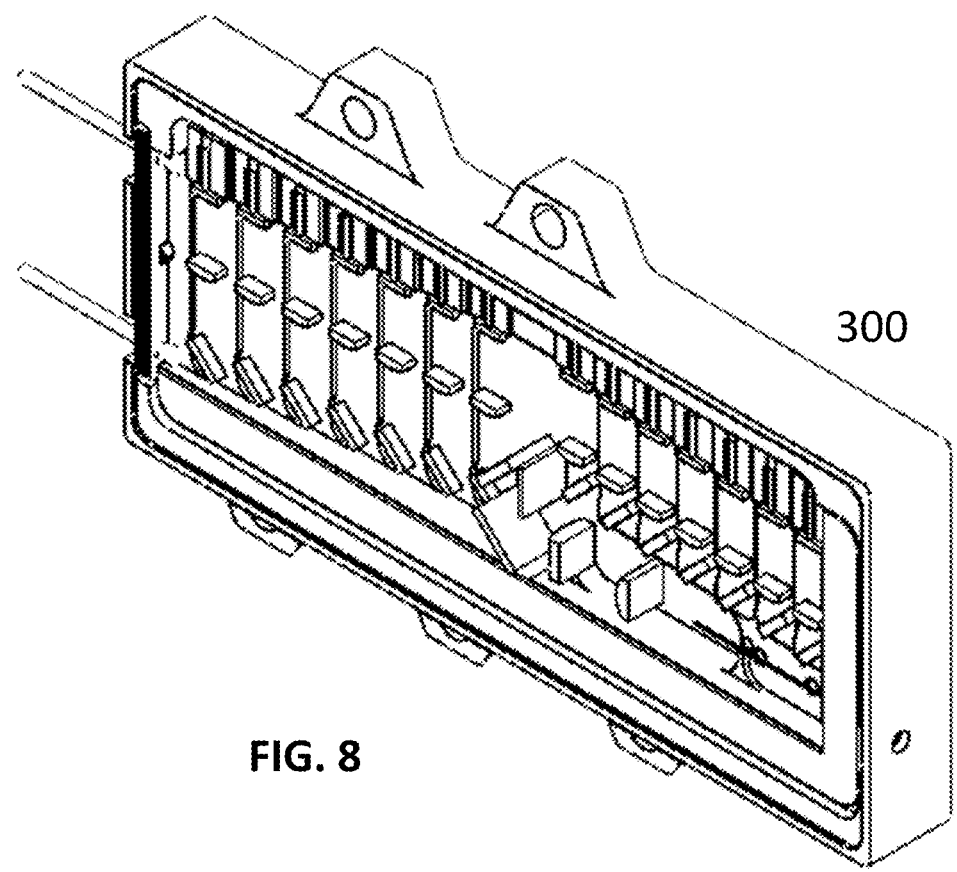

The figures, such as FIG. 3, show a single emitter per platform module with two rows of single emitters, each comprising seven single emitters. The two rows are arranged along one side of the module, such that the optically stacked beams do not interfere and are polarization multiplexed prior to launching the beam into a fiber. FIG. 8 shows a 3D drawing of the module 300.

Diode laser modules with multiple emitters typically mount the laser chip flat on the cooling surface. To stack the laser beams along the fast axis, most modules utilize a multi-step cooling base, where laser chips are mounted onto steps at different heights. Each laser beam is collimated in the fast axis and optionally slow axis separately, and turning mirrors are then used to steer all collimated laser beams to the same direction, thus causing all beams to be stacked in the fast axis.

Known multi-emitter modules use (1) interleaved optical paths of the two rows or use (2) a flat ceramic substrate and ceramic spacer to realize the staircase like heatsink or (3) use a flat ceramic substrate and beam bending optics for optical stacking or (4) use a water cooled copper heatsink with angled mounting of the diodes in combination with deflecting mirrors for optical stacking.

In accordance with one embodiment of the present invention, at least parts of the module are machined from metal such as copper. In another embodiment of the present invention, at least parts of the stepped module are made from kilned ceramics. In accordance with an aspect of the present invention, the module is made at least partly from layers of materials that are later bonded. The layers may be copper layers. The layers may also be ceramic layers, for instance made from AN layers that are bonded together by kilning the layers together. In one embodiment of the present invention the ceramic layers include the stepped structure and the outside walls of the module, so that an entire basic module including the stepped structure is made from a single body of bonded ceramics. In the alternative the body, including the external body and the stepped structure are all machined from a single piece of metal such as copper. In yet a further embodiment of the present invention the layers may be a combination of one or more layers of conducting material such as copper and one or more layers of isolating materials such as ceramics. In one embodiment of the present invention a metal layer or conductors are embedded in the ceramic body to provide a conductive path for the electric current. The ceramic body in one embodiment is made from stacked ceramic green sheets that are co-fired in a furnace. Other manufacturing processes of a ceramic body are contemplated. For instance one may prefer to machine fired ceramics such as MN or apply a die and/or mold to produce a green shape that is then fired in a kiln.

In accordance with an aspect of the invention, the thermal, and thus the operational behavior of a module, is dramatically improved by applying cooling pathways inside the stepped body of the module for forced liquid (e.g. water) cooling. The cooling pathways include an inlet in a base of the laser module, an input manifold (or channels) connecting the inlet to a plurality of cooling channels, wherein one of the cooling channels runs a length of the platform across at least a part of the width of the platform. The coolant from the cooling channels runs the length of the platform and exits the cooling channel into an output channel, and then to an outlet where it exits the laser module. In one embodiment of the invention, a plurality of walls are located in the cooling channels. Preferably, the walls in a cooling channel are positioned underneath a laser source which is secured atop the platform containing the cooling channel. Thus, in this embodiment, a laser source is atop the walls.

The staggered or stepped configuration of the laser module, for instance, as shown in FIG. 3 and in FIG. 8, poses a challenge for creating cooling channels. It is difficult to achieve efficient and effective cooling and a consistent level flow is difficult as the laser sources that have to be cooled are positioned on platforms that are at different levels relative to the base of the module. The problem of channeled liquid flow through the body of the laser module is solved in different embodiments of the present invention.

Figure 10:
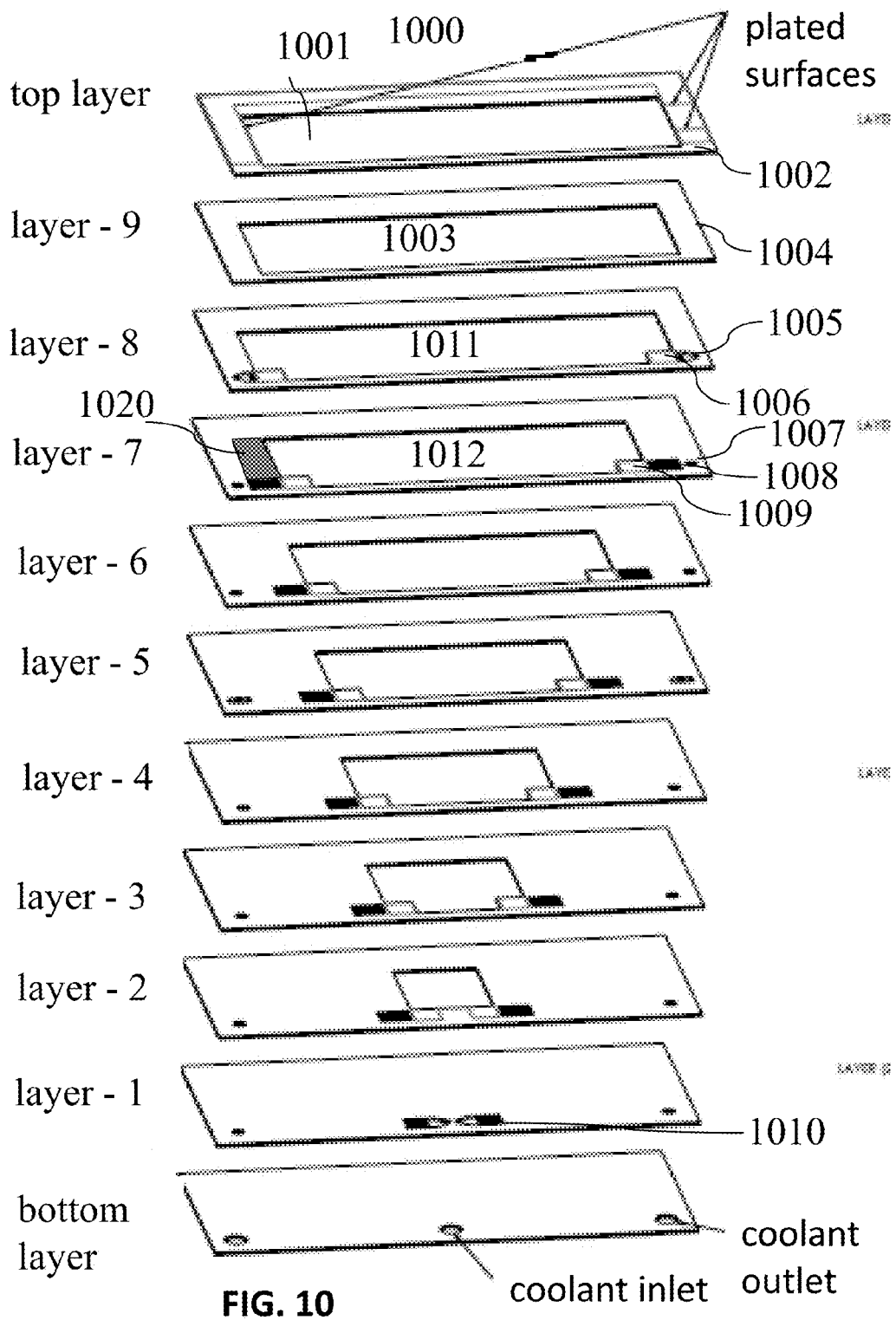
FIG. 10 illustrates a construction of a laser module having stepped platforms and a plurality of cooling channels made from multiple ceramic layers in accordance with an aspect of the present invention.
Figure 11A:
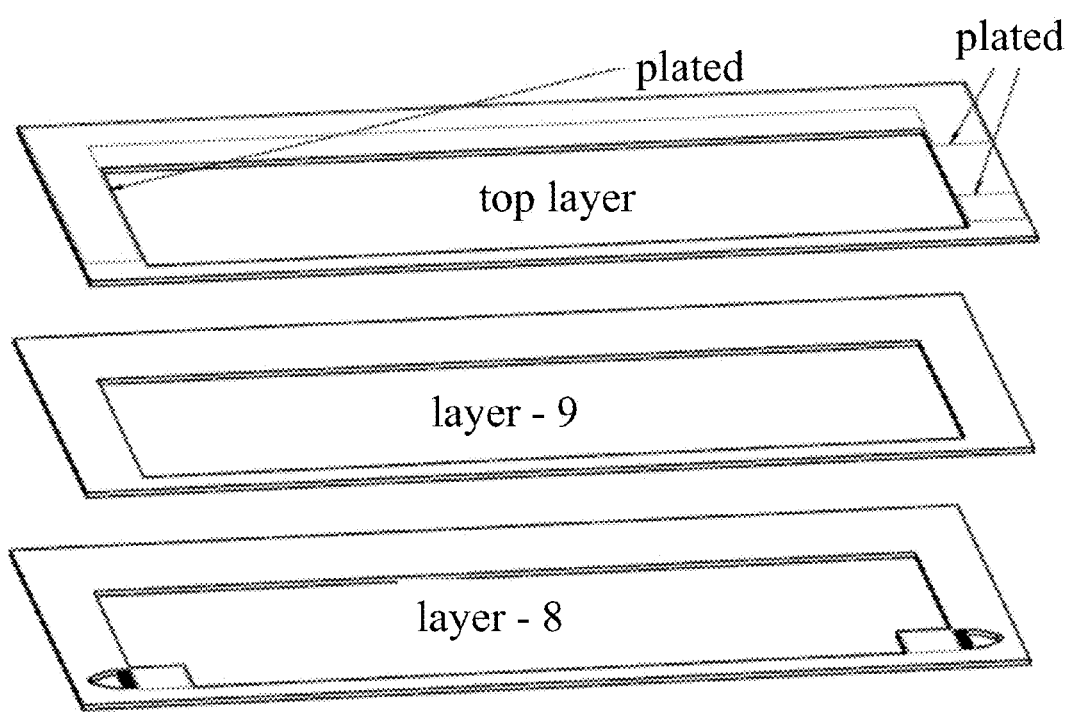
FIGS. 11A, 11B, 11C and 11D illustrate details of several of the ceramic layers shown in FIG. 10.
Figure 11B:
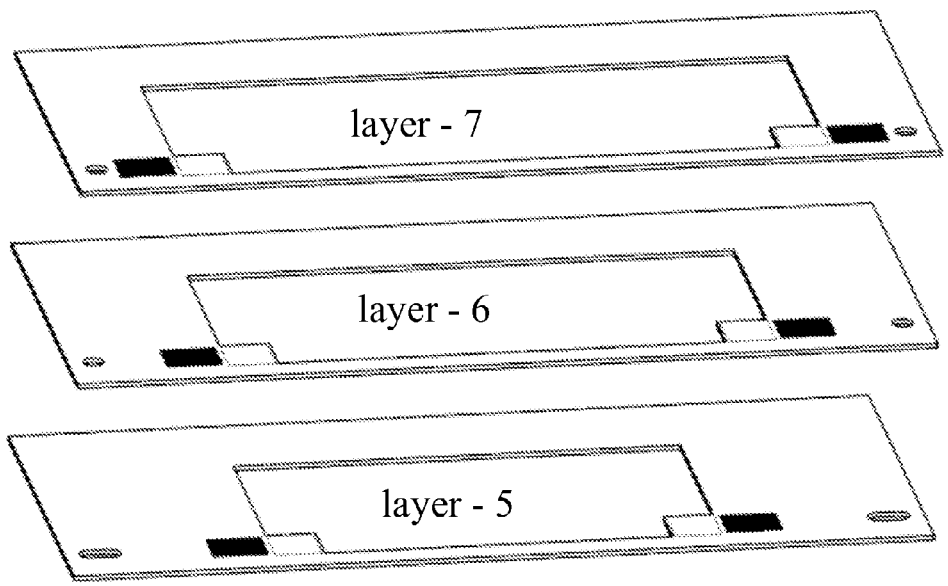
Figure 11C:
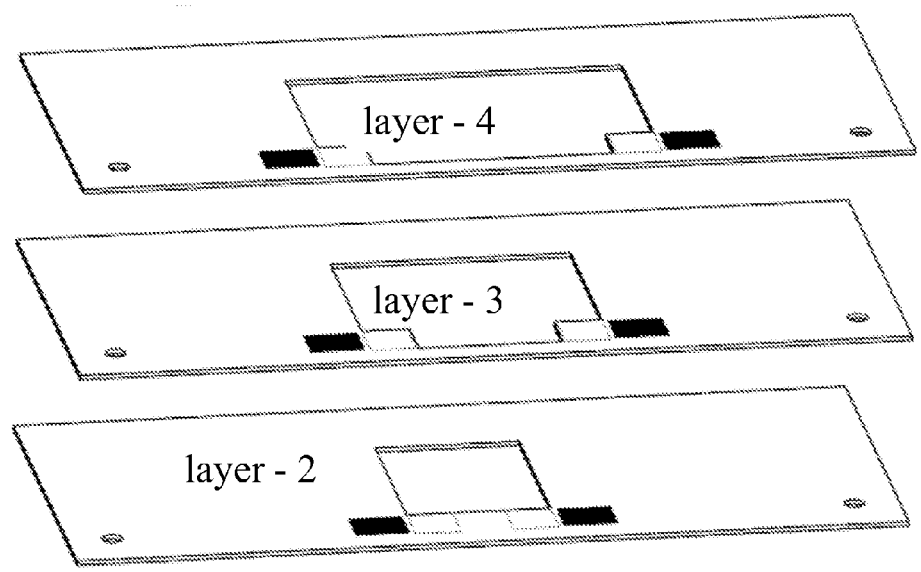
Figure 11D:
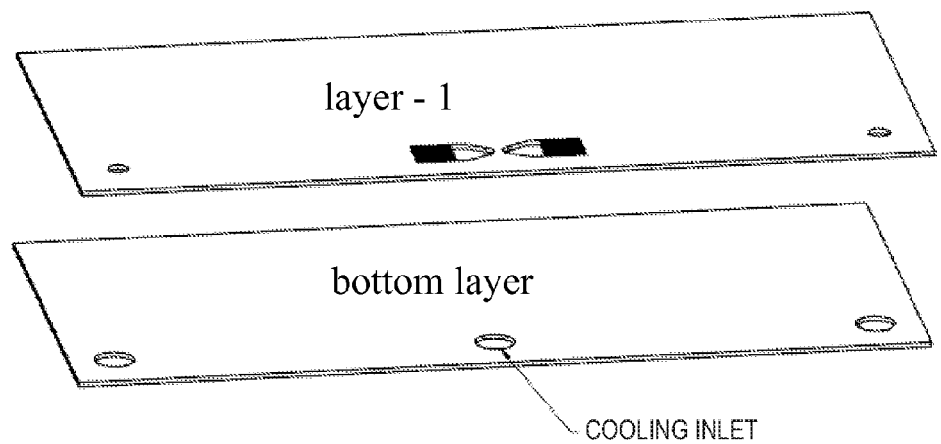

An embodiment of the present invention is illustrated in FIG. 10. FIG. 10 illustrates a laser module, before formation, that is formed from layers of materials. The layers may be ceramic layers, the layers may also be metal, such as copper layers. The layered approach enables the construction of a complete module that contains channels for transportation of cooling liquid. However, the layered approach also is an alternative for machining a work piece or for other manufacturing methods. Layers may be formed individually and stacked and bonded together after stacking. Bonding with ceramic layers can take place by either low temperature and high temperature firing in a kiln or furnace. One distinguishes in general Low temperature co-fired ceramics (LTCC) and high temperature co-fired ceramics (HTCC). Low temperature in LTCC indicates that the sintering temperature is around or below 1,000° C. High temperature in HTCC indicates a temperature around 1,600° C. Co-fired in general means co-fired with other components. The layer thickness is at equal or close to equal the fast axis collimated beam height or at least high enough as to prevent two adjacent or stacked beams to interfere with each other.

FIG. 10 provides an illustrative example of a layered module body of a stepped or staggered laser module with added channels for cooling liquid. The method of construction of a laser module can be used with the stepped laser module illustrated in FIGS. 1-9, but it can also be used in any other stepped laser module as well. It is further noted that the layered module 1000 is provided as a symmetrical model to demonstrate the layered approach. One can see that the module as illustrated in FIG. 9 would have a different shape of the layers. However, the approach remains the same for creating steps and positioning the laser sources. However, the shape of the cut-out may be modified at one side to create room for placing the common optics.

The illustrated module 1000 of FIG. 10 has 11 layers to accommodate a total of 14 laser sources, 7 at each side of the module. FIG. 10 shows additional layers on the top and the bottom of the module to cover the openings for coolant flow. These layers may be omitted in a layered approach without cooling channels.

FIG. 10 module 1000 shows a top layer 1002 with an internal opening 1001.

The top layer, when made of ceramic material, also has plating attached to it. For instance the surfaces may be plated with metallic layers known to the person skilled in the art, such as Ti/Pt/Au/Ni/Au that is designed for excellent adhesion, minimum electrical impedance, local wire bonding and soldering Layer 9, identified as 1004 with internal opening 1003, closes off the coolant opening. The following layers accommodate laser sources on identified portions of the platforms.

In the layers following the layer 8 going down, the internal openings will become smaller. For instance, in layer 8 the internal opening is 1011 and in the next layer, layer 7, the internal opening 1012 is smaller, providing more ceramic material that will form the step or platform associated with that layer.

Layer 8 has a large internal opening 1011, a patch 1006 to host a laser source and a coolant return flow opening 1005. The layer as shown is symmetrical and has the same (but not specifically identified) hosting patch and coolant opening.

The next layer, layer 7, has a large internal opening 1012, which is smaller than large internal opening 1011 of the layer above it. On the left side the difference is marked as area 1020, which will form the visible platform of this layer. On the right side of layer 7, patch 1009, coolant channel 1008 and coolant return opening 1007 are identified. Coolant channel 1008 is located directly beneath patch 1006 of the next layer, thus enabling the cooling of the laser source attached to patch 1006. Coolant channel 1008 and return flow opening 1005 overlap so that coolant can flow from 1008 to 1005. Return opening 1005 connects to return opening 1007. This assures that coolant that is flowing up through 1008 can be returned via 1005 through 1007 downwards. The structure of the underlying layers 6 to 2 is essentially similar in this example with a diminishing internal opening. Layer 1 does not have patches for laser sources, only coolant channels 1010 in conjunction with an inlet manifold for cooling the patches above it. The bottom layer has the required bottom inlet and outlet.

The layered approach can be applied with and without the coolant flow openings and channels. However, the effect of applying coolant through coolant openings is significant. The application of water as coolant allows improved cooling of the laser diodes and such extracting more output power from a given assembly compared to passive cooling. In one embodiment of the present invention, operating conditions are selected to yield a typical junction temperature of the laser diodes of 65 degrees C. for highest reliability with an inlet water temperature of not higher than 25 degrees C., or at a temperature at which water is provided by a public water utility. A varying number of single emitter laser diodes or laser diode bars with multiple emitters may be deployed in the assembly depending on the requirements on output power and beam quality. The water provided at the inlet of the module when the module is made of ceramics is preferably not de-ionized water.

One of ordinary skill will recognize the importance of operational power and temperature of the module and of the water at the inlet and the size of the laser module. Laser sources operate at highest optical output at a highest possible current. However, the higher the current, the more heat is dissipated. High heat dissipation raises in general the temperature of the laser source which affects negatively the life of the source and the performance of the laser source. It is beneficial to apply the highest possible current to a laser source, while maintaining a low temperature. Furthermore, a laser module with a plurality of laser sources easily generates excess heat that has to be dissipated. One may dissipate the heat through conductive heatsinks.

A laser machine tool center or other laser devices may use a plurality of laser modules in order to create a large combined optical output, for instance in the kWatt range. Space and cost are at a premium and it would be desirable to have a minimum number of laser modules produce the highest possible optical laser output, without negatively affecting the life span of the modules. Accordingly, it is beneficial to create cost effective laser modules that are relatively small with a relatively high laser output, each operating at an optimal temperature. Accordingly, the compact laser modules that are provided herein in accordance with various aspects of the present invention and that are optionally liquid cooled are desirable devices.

Figure 12A:
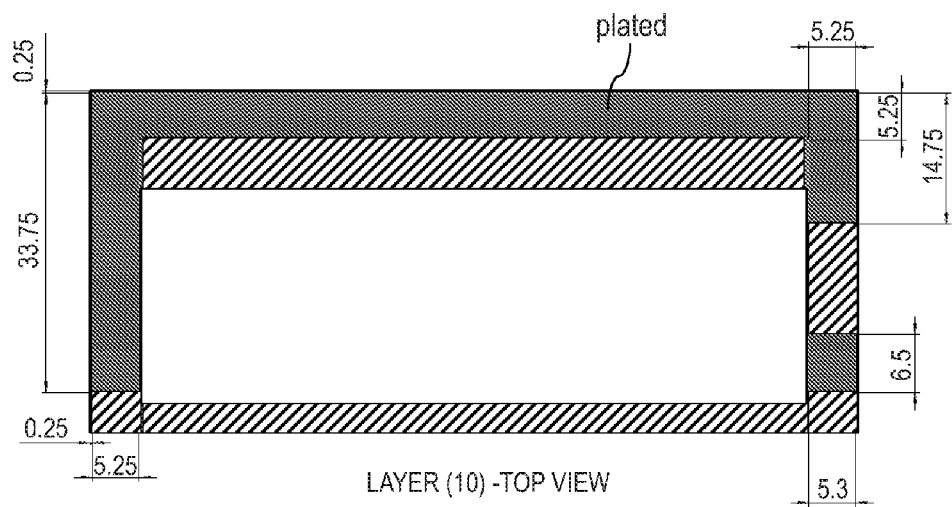
FIGS. 12A, 12B, 12C and 12D illustrate details of several of the ceramic layers shown in FIG. 10.
Figure 12B:
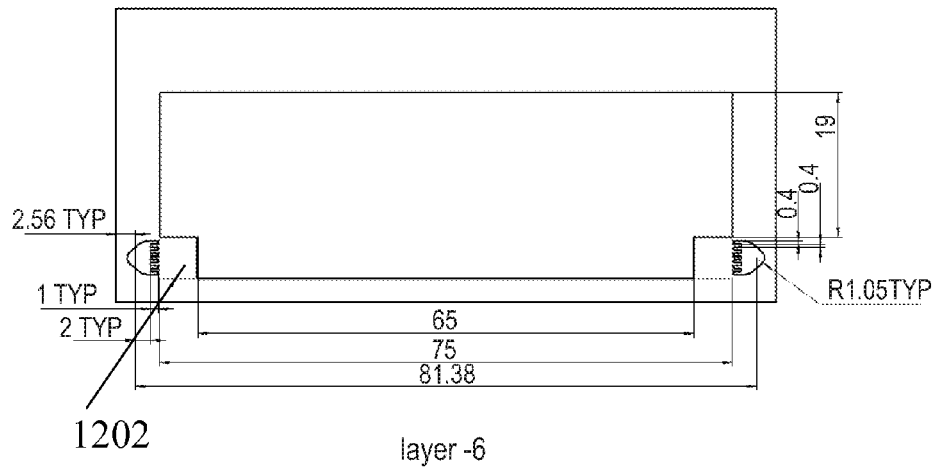

As mentioned above, FIG. 10 illustrates the set of layers in a perspective overview. Further details of individual layers in a perspective view are provided in FIGS. 11A, 11B, 11C and 11D. FIGS. 12A, 12B, 12C and 12D provide a top view of the plated top layer, layer 6, layer 3 and layer 1. FIG. 12A illustrates the top layer, with the dark areas being plated with a conductive layer to conduct current and the patterned area being unplated. All measurements are in mm and provide an impression of the size of the module, patches and channels. FIG. 12B identifies patch 1202 for attaching a laser source. The surface of area 1202 in one embodiment of the present invention has Ti (0.4 m), then Pt (0.4 m). The solder on top may be eutectic AuSn (4-6 μm) with a melting point of 285+/−5° C.

Figure 12C:
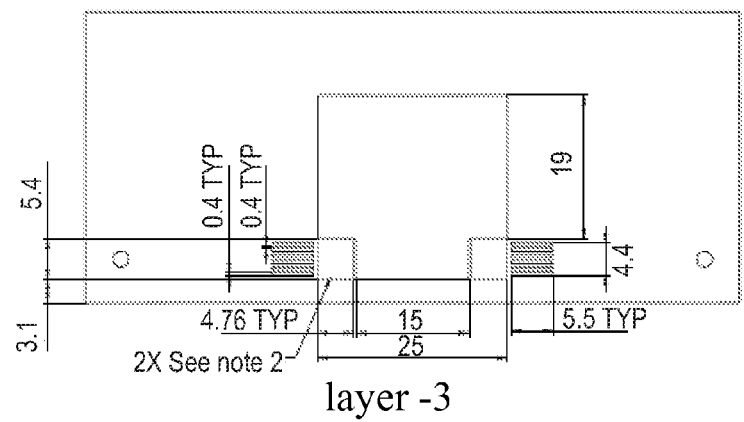
Figure 12D:
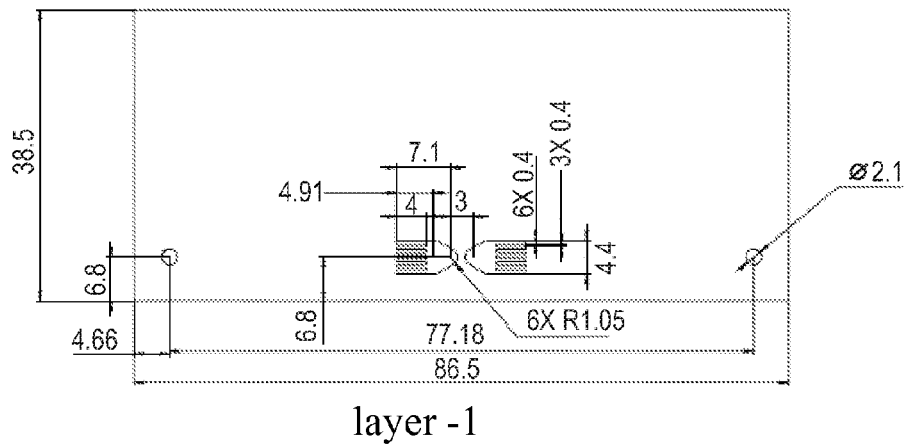

FIGS. 12C and 12D further illustrate that the cooling channel may be formed from microchannels with a width of typically 0.4 mm for improved heat dissipation.

In accordance with an aspect of the present invention, another embodiment of a laser module with cooling channels for liquid cooling is provided. It was realized that additional benefits are obtained from a flow pattern through or along the platforms and by placing liquid inlet and outlet on different sides of the laser module. This allows for cooling of the optics placed on the platforms and of the common optics such as the combiner. Furthermore, a flow of liquid along the surface of the platform will act as a heat exchanger.

Figure 13:
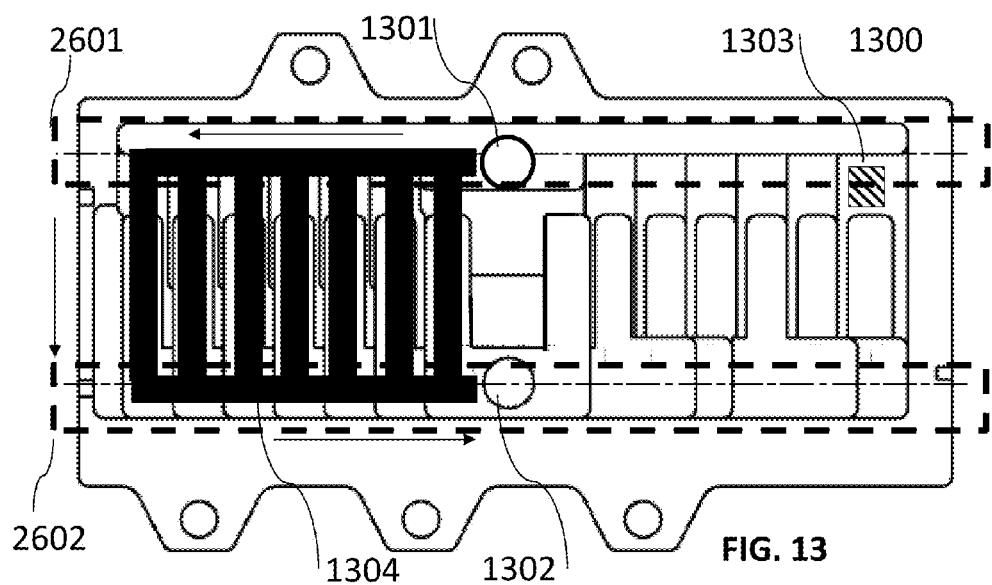
FIGS. 13 and 14 illustrate the flow of coolant in a stepped laser module in accordance with an aspect of the present invention.

One possible flow model of the cooling liquid, in accordance with an aspect of the present invention, is illustrated in FIG. 13. This diagram only illustrates part of the general flow from a liquid inlet 1301 to a liquid outlet 1302 on another side of the laser module 1300. To visualize the orientation of the module 1300, one laser source 1303 has been identified. FIG. 13 provides a top view of the module 1300. In order to illustrate a flow from an inlet to an outlet, a flow pattern has been placed on top of the view. One of ordinary skill would readily understand that the channels for liquid flow are inside the body or platforms of the module and would of course not be directly visible. To prevent overcrowding of the diagram only a global view of the flow on one side of the module has been provided. This is not a detailed channel view. However, it clearly shows at least one principle of the cooling liquid flow.

Cooling liquid enters into the channels at the inlet 1301. It flows through an input manifold at the top of the figure and into a first side of cooling channels 1304 that run along the length of the stepped platforms in the figure to the left. The channels turn downward in the diagram through the individual platforms passing directly under the laser sources on the platforms. Preferably, walls or ridges or narrow channels or microchannels are formed directly under the platform where the laser diode is mounted, extending in downward direction in the diagram following the platform for at least 3 mm before the channel directly under or in the platform widens again and covers substantially the entire area of the platform. Substantially covering herein means preferably covering at least 80%, more preferably covering at least 90% and most preferably covering at least 95%. The channels under or in the platforms are created by ridges or walls between the platforms, so that each platform has its own channel. In accordance with an aspect of the present invention, the laser source is positioned on the platform atop the walled section of the cooling channel. The dark sections of 1304 in FIG. 13 show a flow of cooling fluid through channels in or under the platforms on the left side of module 1300. The channels on the right side of 1300 in one embodiment of the present invention are connected through a channel system shared with 1304 to inlet 1301 and outlet 1302. In one embodiment of the present invention the cooling channels on the left side and the right side of module 1300 are separate cooling systems.

The liquid from the channels in the platforms is collected in a return channel or an output manifold that leads to a liquid outlet 1302. The coolant flows out of the base of the laser module through outlet 1302.

The connection inside the body of the laser module that connects the inlet 1301 to the channels in the platforms is called an input manifold and is indicated as box 2601 with dotted lines, as it is not visible from the outside in the view of FIG. 13, but is definitely present. The connection for cooling flow from the inlet 1301 to the channels in the platform that is called the input manifold 2601 herein is illustrated in a cross sectional view in FIG. 23. Note that in FIG. 23, the input manifold is shown as being stepped. It may also be a sloping linear or other non-linear shape to accommodate the stepped platforms. The input manifold 2601 may be realized in different forms, for instance it may be separated in a left and a right input manifold that cools the left and the right set of platforms with separated flows.

The cooling fluid after flowing through the body and under or through platforms is collected through an output manifold 2602, which is indicated by dotted box 2602 in FIG. 13 and outputted to outlet 1302.

Figure 19:
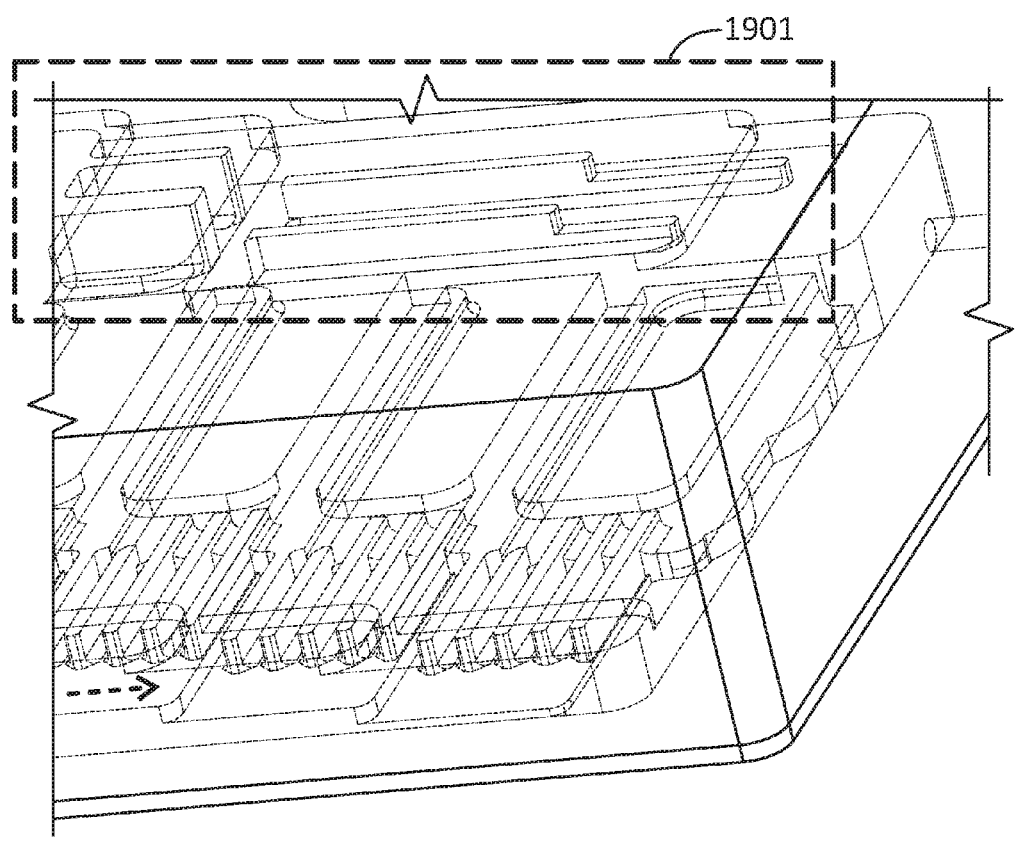

This connection that enables the collection of cooling fluid with waste heat from the channels to the outlet 1302 and that is called output manifold 2602 is illustrated in a cross sectional view of 1901 in FIG. 19. The output manifold can be stepped or it can be another sloping linear or non-linear shape that follows the stepped platforms.

The diagram of FIG. 13 demonstrates how the liquid flows under the laser sources through the platforms, thus cooling the laser sources and the optics on the platforms. The flow of the coolant through the cooling channels in the platforms also cools the optical components, including the combining optics. In one embodiment the coolant flows in parallel circuits beneath all laser sources ensuring a similar temperature of all laser diodes and thus identical wavelength. In another embodiment, the coolant flows at least partially, in series beneath groups or individual laser sources resulting in a specific temperature of the different laser sources and thus a slightly different emission wavelength.

Accordingly, the embodiment of the present invention illustrated by FIG. 13, provides an integrated cooling system of a stepped laser module, which in one embodiment, has at least 14 different laser sources. The layered approach as provided earlier above either with metal layers or with ceramic layers are applied to realize the construction of the body with platforms and flow channels. Other methods of constructing the body can also be used. For example, fewer layers can also be used.

Figure 14:
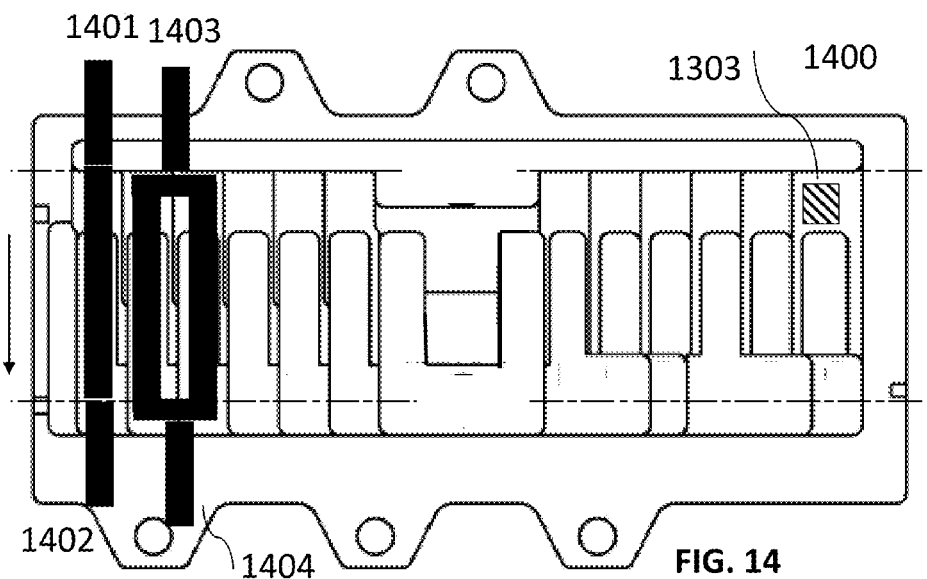

In accordance with an aspect of the present invention, the cooling system of the laser module is at least partially integrated. In such an embodiment, multiple inlets and outlets are provided and the cooling liquid in one channel is not directly connected to other channels. In one instance the temperature of the cooling liquid returning on the right side may be too high to adequately cool the optical combiner. In that case an individual cooling system for a single channel between single outlets 1401 and 1402 of a partially integrated cooling system in a module 1400 may be provided or inlet 1403 and outlet 1404 of two channels may be provided. In one embodiments of the present invention, one may for instance provide separate integrated channels and inlets and outlets for the left side and the right side of the module. This requires connection and management of several inlets and outlets of cooling liquid in one module as illustrated in FIG. 14 and thus is more complicated than the embodiment of FIG. 13.

Figure 15:
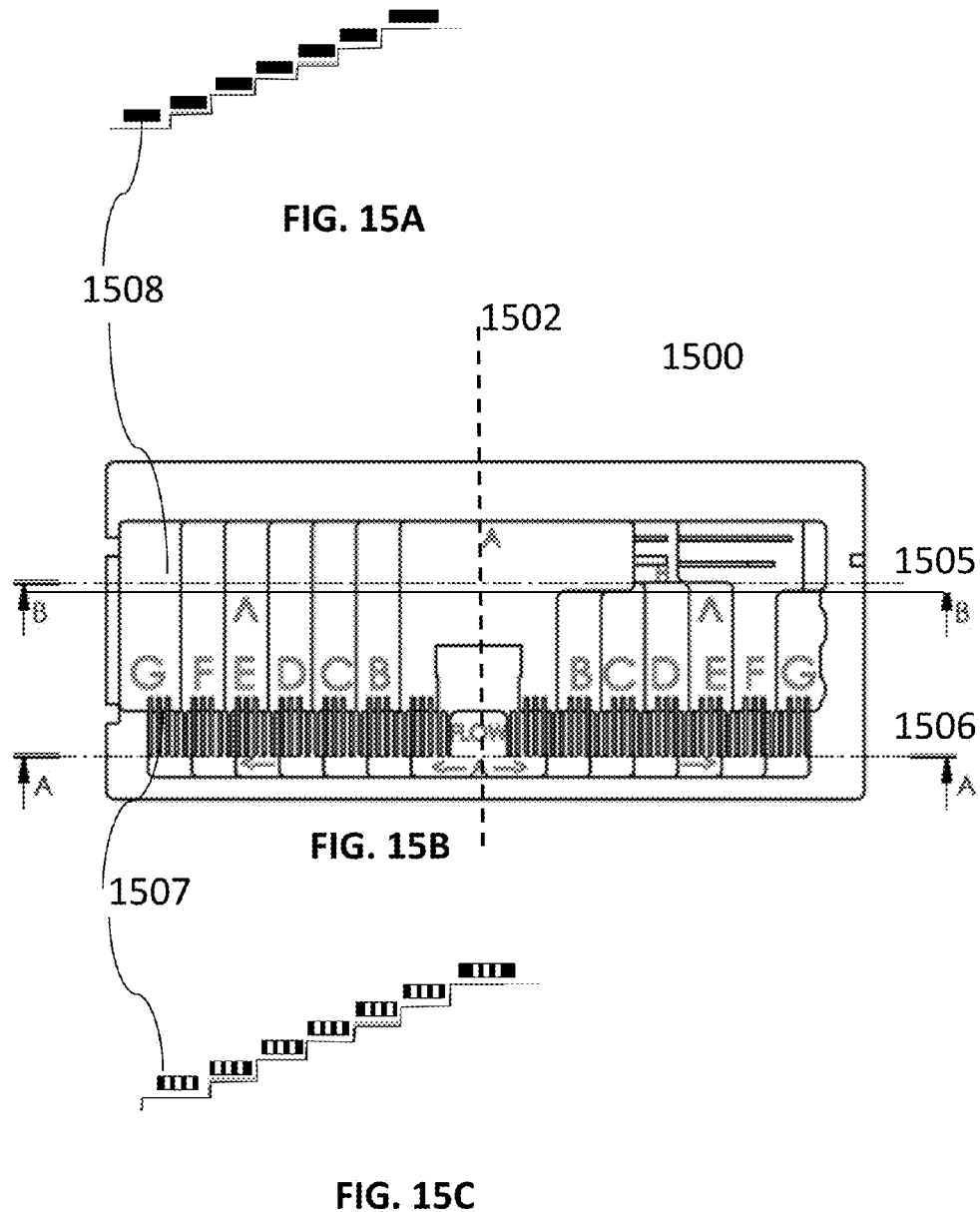
FIGS. 15A, 15B, 15C and 16 illustrate cross sections of the cooling channels at different locations in the module in accordance with an aspect of the present invention.
Figure 16:
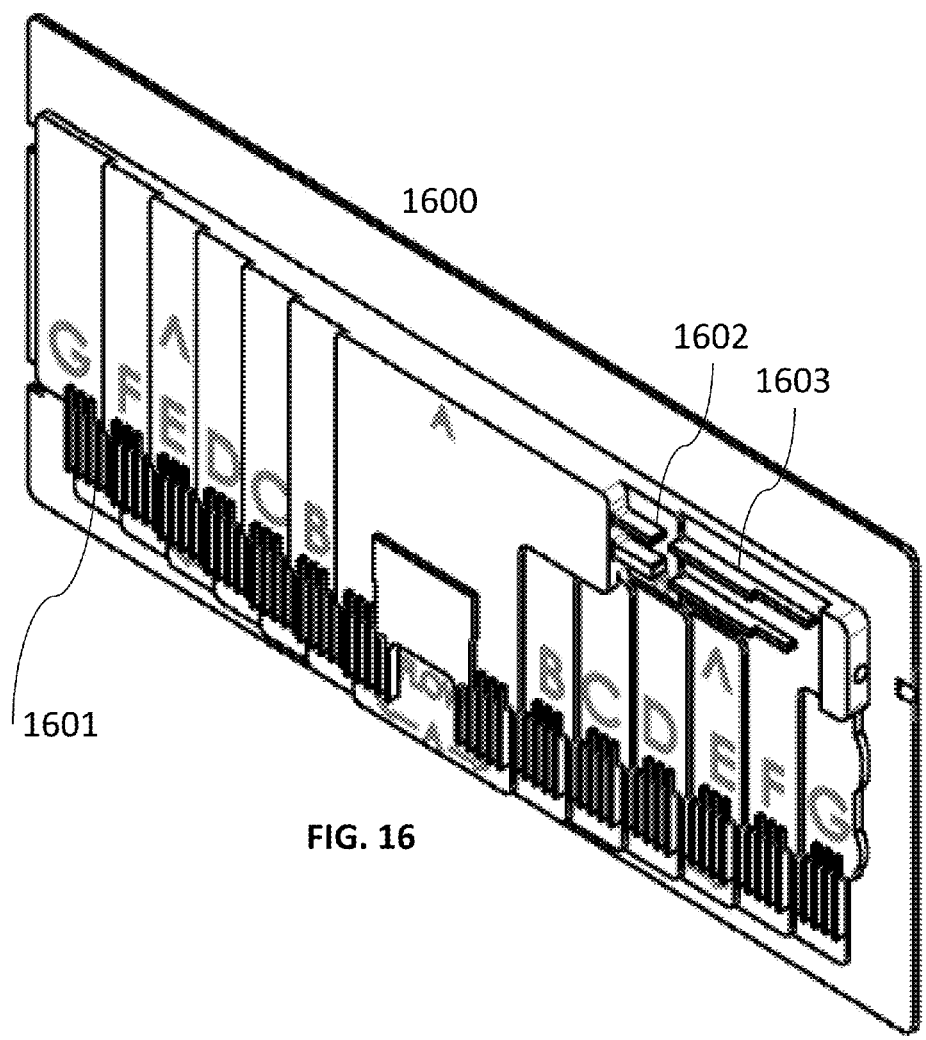

FIGS. 15A, 15B, 15C and 16 provide details of a further embodiment of the integrated cooling body of the present invention as illustrated in FIG. 13. One is again reminded of the stepped construction of the body of the laser module as provided herein. A diagram of an integrated channel construction of a stepped body of a laser module as an embodiment of the present invention is provided in FIG. 16 in a 3D view looking at an opened body 1600 to display the channels from a bottom view. FIG. 16 specifically identifies walls or microchannels 1601 positioned directly under the laser sources which expand into broad channels in the platforms and channels 1602 and 1603 in the return direction to the liquid outlet. The platforms are sloped upward as one progresses toward the middle of the body in FIG. 16 as shown. This is because this is a bottom view that corresponds with the platforms going downhill from the outside in, from a top view as shown in FIG. 8, for instance.

FIGS. 15A, 15B and 15C illustrate details of FIG. 16 from a 2D bottom view. The laser module 1500 is illustrated from an open bottom view in FIG. 15B. It identifies walls or microchannels 1507 located inside the cooling channels located inside the platforms on which the laser sources are mounted, directly under a laser source and a wider platform channel 1508 going through one platform. The diagram of the platform is bisected into a left part and a right part by a line 1502. To illustrate the platform cooling channel and the wall structure, the laser module part left of line 1502 is illustrated in cross-sectional view in FIG. 15A as a cross section along line 1505. FIG. 15A shows in cross section a part of the body upside down to match the view of FIG. 15B. The channel 1508 through a platform is shown in cross-section. FIG. 15C shows a cross-section view along line 1506, which crosses the microchannels 1507 below the mounted laser sources. The laser sources are not shown in these figures.

The base of the laser module can be metal or it can be ceramic. In the case of ceramic construction, it can be a single integrated piece of ceramic material which can be formed by layers of ceramics formed into one piece in an oven. Unwanted material can be machined away from the integrated base. FIG. 16 further depicts another embodiment of the invention where the part is not made out of individual layers for each platform, but rather from a two parts, preferably made from ceramics. The part with the integrated cooling channels is shown in FIG. 16. On the other side of this part, the platforms for mounting the individual laser sources and the associated optics are formed. A second part closes of the channel structure such that the coolant structure is formed as described above and all channel sections are sealed. The two parts are preferably made pressing green ceramics, but other methods, such as molding or CNC machining are also contemplated. In accordance with an aspect of the present invention, an integrated ceramic body is preferred.

Figure 17A:
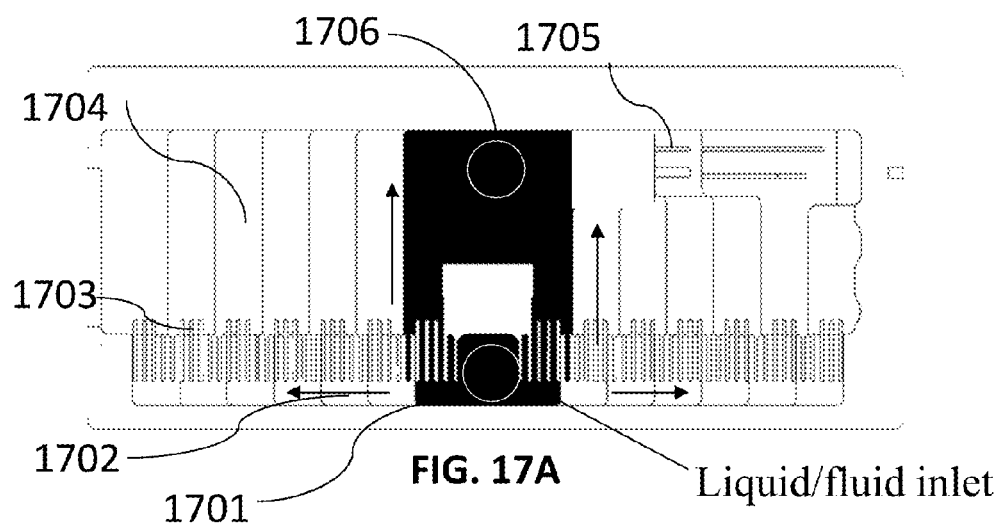
FIGS. 17A, 17B, 17C, 17D, 17E, 17F, 17G and 17H illustrate the flow of coolant in a stepped laser module in accordance with an aspect of the present invention.
Figure 17B:
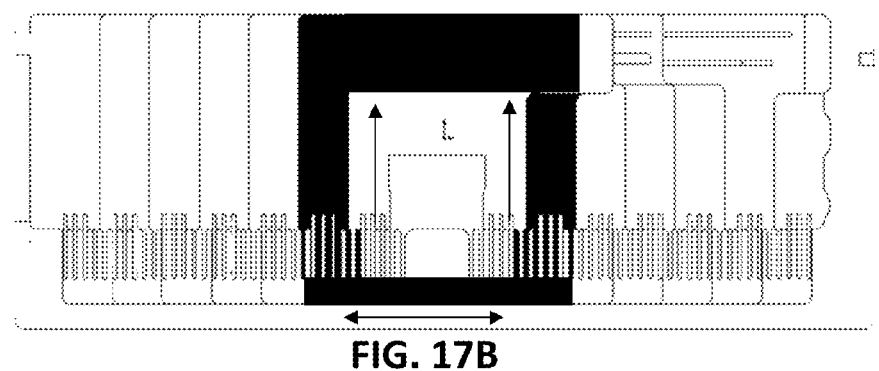
Figure 17C:
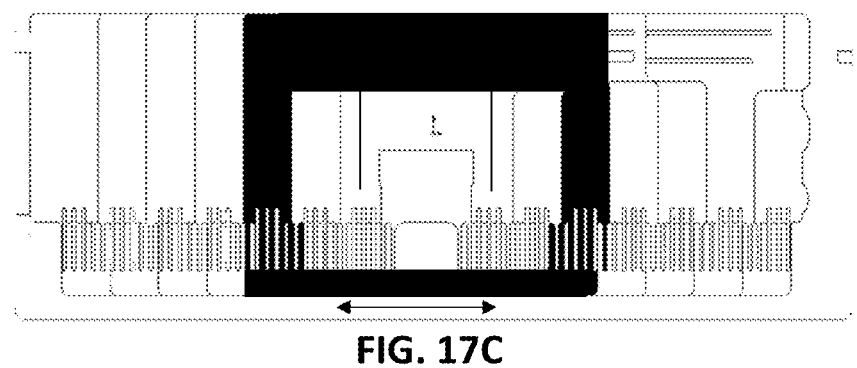
Figure 17D:
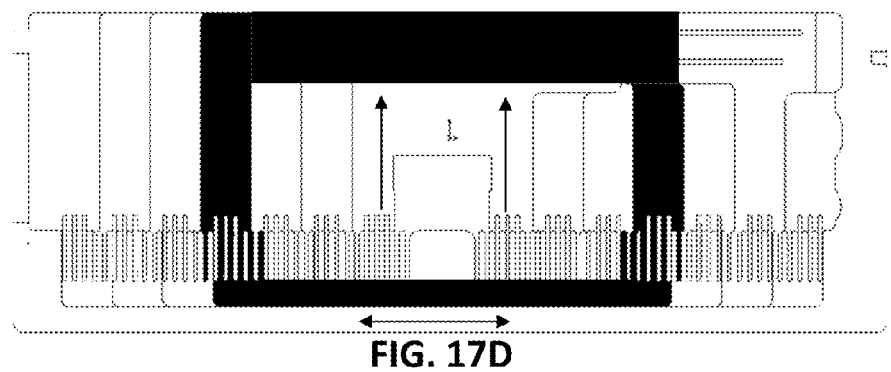
Figure 17E:
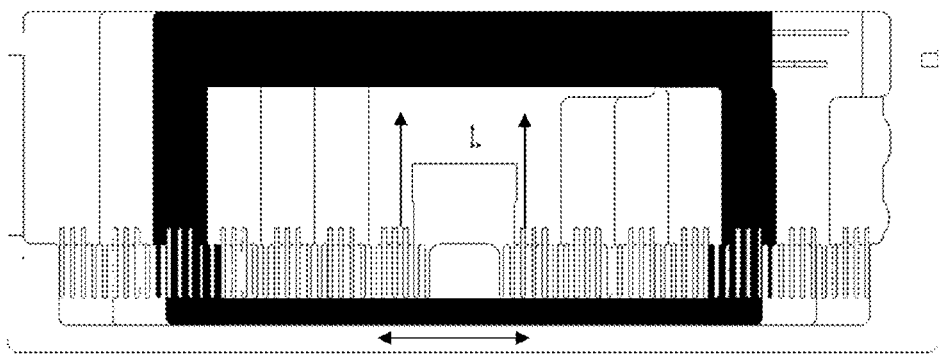
Figure 17F:
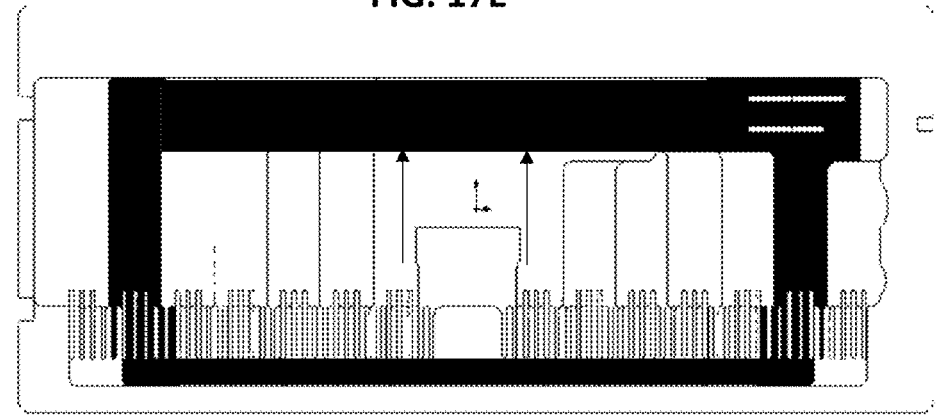
Figure 17G:
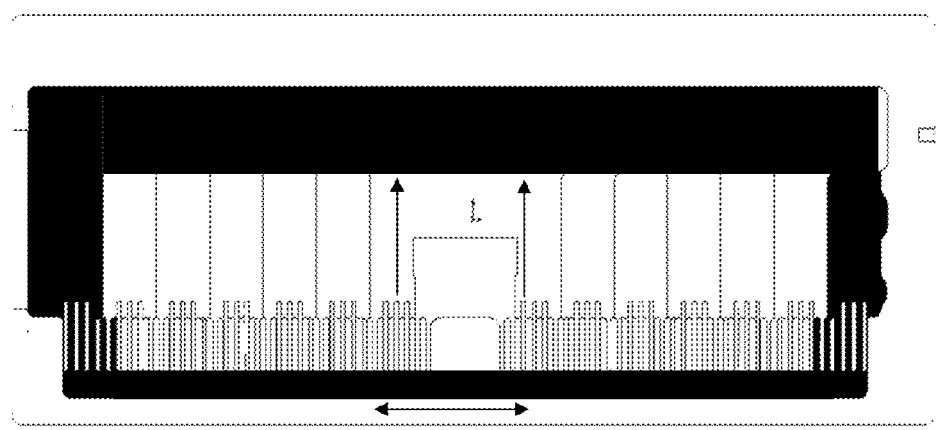
Figure 17H:
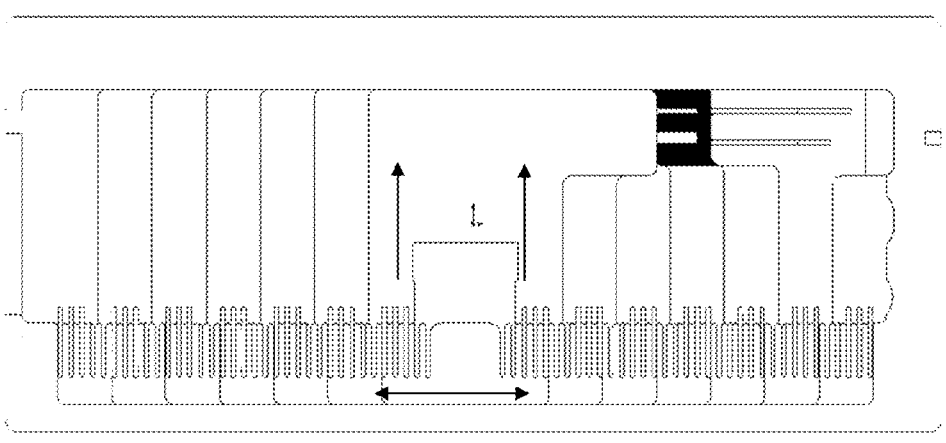

The inflow of fresh cooling liquid into the integrated cooling system, in accordance with one embodiment of the present invention, is illustrated in FIGS. 17A, 17B, 17C, 17D, 17E, 17F, 17G and 17H. Each drawing shows a next stage of flow of liquid into the channels. The liquid flow is a continuous process and when liquid moves through an inlet 1701, through an input manifold 1702 which is connected to each cooling channel in a platform to supply coolant to the cooling channel, preferably through microchannels 1703. From the input manifold 1702, via microchannels 1703, the coolant flows to successive coolant channels 1704, including the middle of the stepped structure, and through the output manifold 1705 collecting the coolant form each channel and directing it to the outlet 1706. The outlet manifold 1705 has a maximum cross section to minimize associated pressure drop and support walls may be integrated for improved mechanical stability. The dark spots in the drawings indicate presence of liquid at a certain moment. Again, the whole system is flooded with liquid. The drawings 17A through 17 H only serve to illustrate the different stages of flooding the channels and the order of flooding, wherein each stage is identified separately. It is to be understood that once channels are flooded they remain flooded until the flow of cooling fluid is turned off. FIG. 17A shows liquid entering the device through the liquid inlet, which is marked for convenience but is not visible in this view. The liquid flows from the inlet by flooding the channels in upward and left and right direction in the bottom view, as indicated by the arrows. The liquid will leave the integrated cooling system through the outlet 1706, which is not visible in this view.

Figure 18:
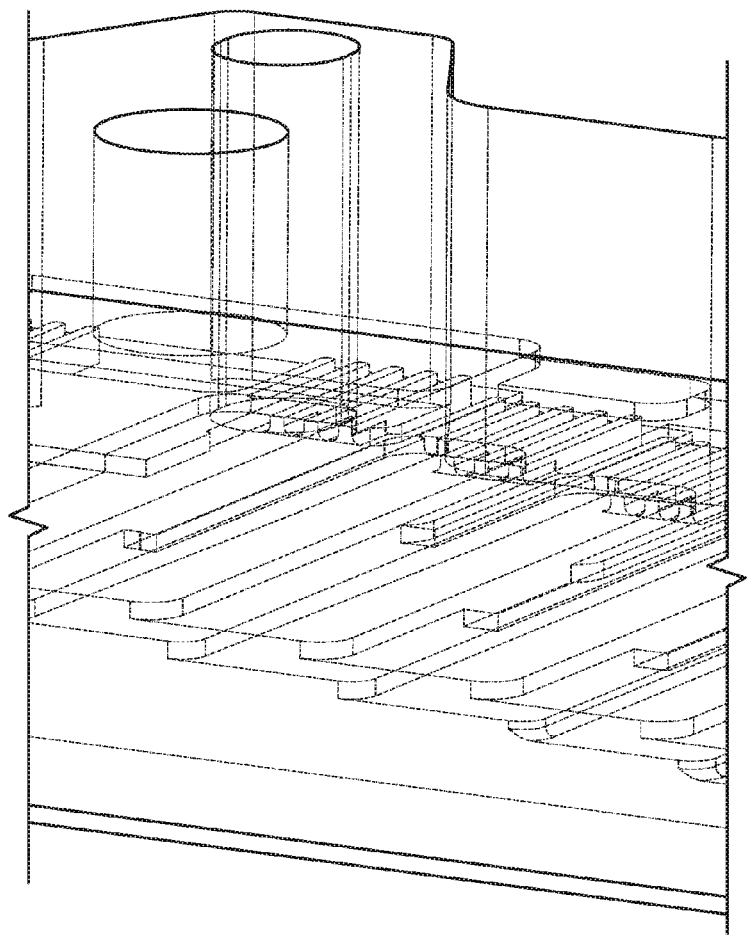
FIGS. 18 and 19 are a three dimensional view of the cooling paths in a stepped laser module in accordance with aspects of the present invention.

To further visualize the cooling system in 3D, a 3D drawing of the channels around the inlet is provided in FIG. 18. FIG. 19 also shows a 3D drawing of some of the platforms, some of the cooling channels and some of the plurality of walls inside each cooling channel. It is clearly shown that the platforms, the channels in a platform and the walls in the cooling channels are at different levels of the body and that the channels cover a length of each platform, or and at least a portion of the length of a platform, such as 80%. In accordance with an aspect of the present invention, the cooling channels are each located a specified distance below the top surface of the platform that contains the cooling channel. I accordance with another aspect of the present invention, that distance is less than 1 mm.

It is further shown the platform adapting the optics of a laser source is recessed to allow for optics that are larger than the beam height of the laser sources and to provide sufficient space for mounting the optic with preferably adhesive to the platform. Therefore the microchannel structure underneath the mounting section of the platform is deeper than the channel underneath the optic mounting section of the platform.

The drawings visualize the aspect of the flow direction of the liquid in the laser module cooling system. The part of the base of the laser module that is opposite of the part that has the laser sources is called the bottom of the module. FIGS. 18 and 19 thus show a bottom-up illustration. The cooling liquid flows up, and left and right and radially away from the inlet.

One of ordinary skill would recognize the difficulties of designing and manufacturing the channels to provide efficient cooling to components at different locations and stacked in a staggered manner, especially with limited inlets and outlets. In fact, one embodiment of the present invention has only a single inlet and a single outlet, which are located on opposite sides of the base of the laser module. Furthermore, the optical components will benefit from cooling. This is especially true for the optical combiner and other common end stage equipment, which is located downstream near the outlet of the cooling fluid, in which the cooling fluid has already heated up during its flow. Several walls or microchannels may be applied, for instance directly underneath the laser source in one embodiment of the present invention and extending beyond the laser source in yet another embodiment of the present invention.

In one embodiment of the present invention, the liquid pressure at the inlet is determined and regulated. A pressure that is too high may damage the walls/microchannels or even the channels through abrasion or cavitation or electro-corrosion, especially when the body of the laser module is made of metal. On the other hand, a pressure that is too low may lead to an inefficient cooling flow. It is further noted that a system of under-pressure relative to the atmospheric pressure may be applied to cause a liquid flow. The ceramic body is designed to handle a defined liquid pressure in the channels without damaging or cracking the body.

In one embodiment of the present invention, the integrated cooling system provides cooling to a laser module with a stepped or staggered platform base for an only upward or only downward going series of platforms within the body, wherein the upward or downward stepping is determined by moving across the steps. In another embodiment of the present invention the integrated cooling system provides cooling to a laser module with a stepped or staggered platform base for an upward and downward going series of platforms within the body, wherein the upward and downward stepping is determined by moving across the steps by starting at a first step. The layout of the cooling channels also covers locations of the optics, so the optics locations are cooled by the flowing liquid.

The manufacturing method of using pre-cut layers of materials allows for very intricate and otherwise difficult to realize cooling channels and allows the creation of a system of cooling channels that flow at different horizontal levels relative to a bottom of the base and that reach different components, including laser sources at different levels and different locations in the laser module. The laser sources are lined up, preferably in one plane, each platform being at a different level than its adjacent platform. The applied laser radiation of each of the laser sources is collimated by at least a fast axis collimator and optionally a slow collimator. The emitting facets of the laser sources facing the collimators are all parallel to each other and preferably the collimated beams of each laser source are substantially parallel to each other. Other geometries/module designs are contemplated as embodiments of the present invention, such as T-bar (one from the left, one from the right and from one from the back) or rectangular shaped orientation or ring shaped orientation of the laser sources all pointing toward one point substantially in the context of positioning and orientation of components and devices means that reasonable effort is made to align and to orientate the components.

When taking a top view, all laser sources appear to be in a single line or row. In a similar view the slow axis collimators in one embodiment of the present invention are also in one row, or are located in one plane in a 3D view. The module has the laser sources distributed over two stepped parts. Taking a top view, the module has a left stepped side hosting preferably n/2 laser sources and a right side hosting n/2 laser sources. In this illustrative example n is 14. The laser module has a staggered structure of platforms on the left side in top view that goes from a highest level near the left outside of the module to a lowest level in a center portion of the module and a staggered structure of platforms on the right side in top view that goes from a highest level near the right outside of the module to a lowest level in a center portion of the module. Each of the platforms that is not at a center of the module only hosts a single laser source in one embodiment of the present invention. A center platform, which may also host optics like the combiner and Bragg grating, may host the lowest location laser source of the left side and a lowest location laser source of the right side of the module in an embodiment of the present invention.

Figure 20:
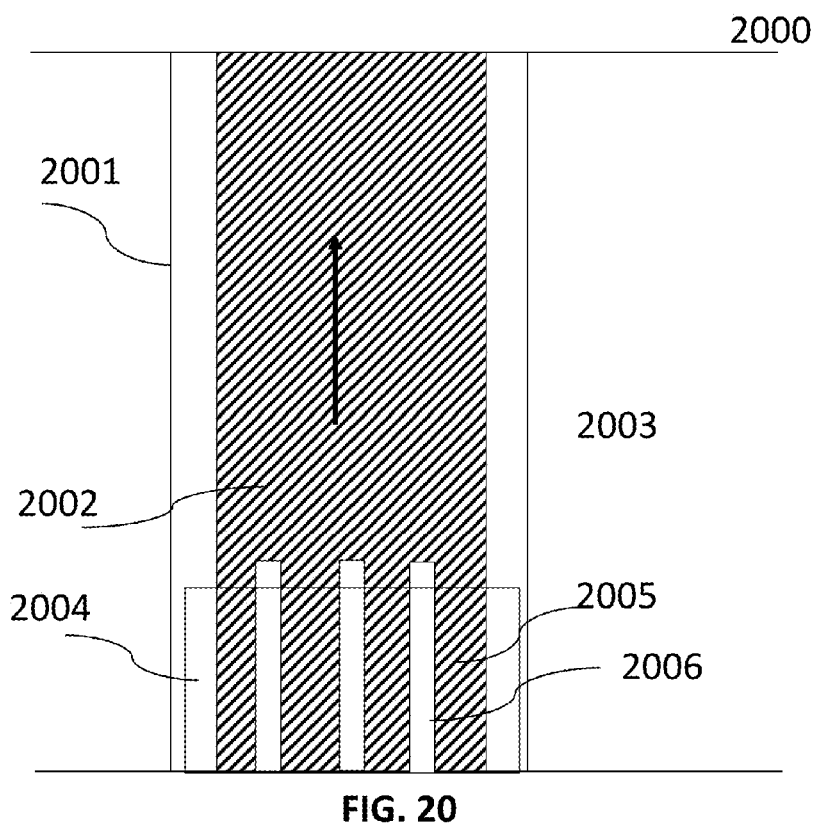
FIGS. 20, 21 and 22 illustrate the flow of coolant in a stepped laser module in accordance with an aspect of the present invention.

The stepped platform structure of a laser module with multiple laser sources and the need for a cooling channel structure has been explained above. Some aspects of a cooling channel structure of staggered platforms that host preferably laser sources are further illustrated in FIGS. 20, 21, 22 and 23. FIG. 20 illustrates a cooling channel running through a platform. It shows a platform 2001 in a module body 2000 and is next to a platform 2003, the platform 2001 shown without its surface layer, thus exposing a channel 2002. On the top layer of the platform 2001 is a patch 2004 with conductive material that is attached to the top surface (not visible) of 2001. In the channel 2002 underneath the patch 2004 holding a laser source such as a laser diode are microchannels 2005 formed by walls or fins 2006. The fins or ridges improve the flow of liquid through the microchannels. FIG. 20 shows three fins or ridges positioned in the opening of the channel. One may insert also more fins or fewer fins. The fins preferably extend beyond the patch 2004, in one embodiment of the present invention, more than 1 mm beyond the edge of the patch. The arrow inside the channel provides the direction of flow of the liquid inside the channel.

Figure 21:
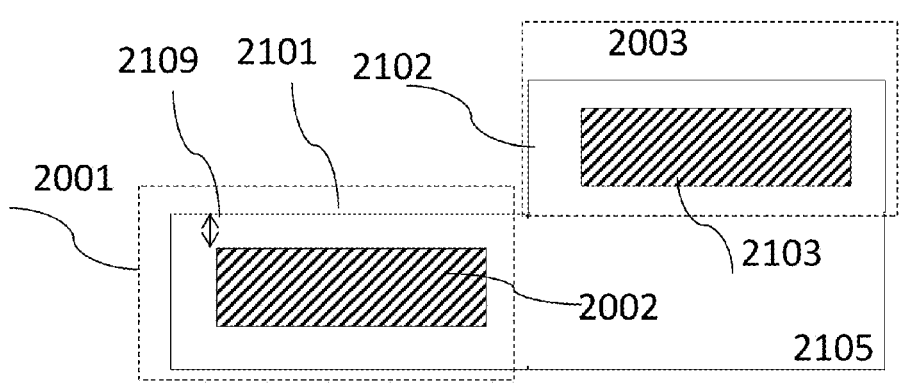

FIG. 21 provides a cross section of the steps 2001 and 2003 on the platforms 2001 and 2003 beyond the area with walled microchannels. To clarify the terminology herein a platform is a volume part of the body of the laser module. One may call the platform also a step. However, the term step will be reserved herein for the surface of the platform. The dotted lines 2001 and 2003 indicate a volume of a platform and in one embodiment of the present invention include inside the platform a channel to conduct a flow of cooling liquid. FIG. 21 identifies the channel 2002 and the top surface 2101 of platform 2001 and the channel 2103 of platform 2003. One can see that the top surfaces of platforms 2001 and 2003 have a height difference identified by 2102. Furthermore, in accordance with an aspect of the present invention, the depth 2109 of channel 2002 below the surface 2101 is predetermined for manufacturing. Preferably, the channel 2002 is positioned as close to surface 2101 to facilitate heat exchange, but without affecting the integrity of the construction of the platforms. In one embodiment of the present invention the distance 2109 of the channel to the surface is not greater than 0.5 mm. In another embodiment of the present invention, the distance 2109 of the channel to the surface is 1 mm or less. The flow of the liquid in FIG. 21 is away from the viewer into the channel. Numeral 2105 is bulk material of the body. In one embodiment of the present invention excess bulk material is removed.

Figure 22:
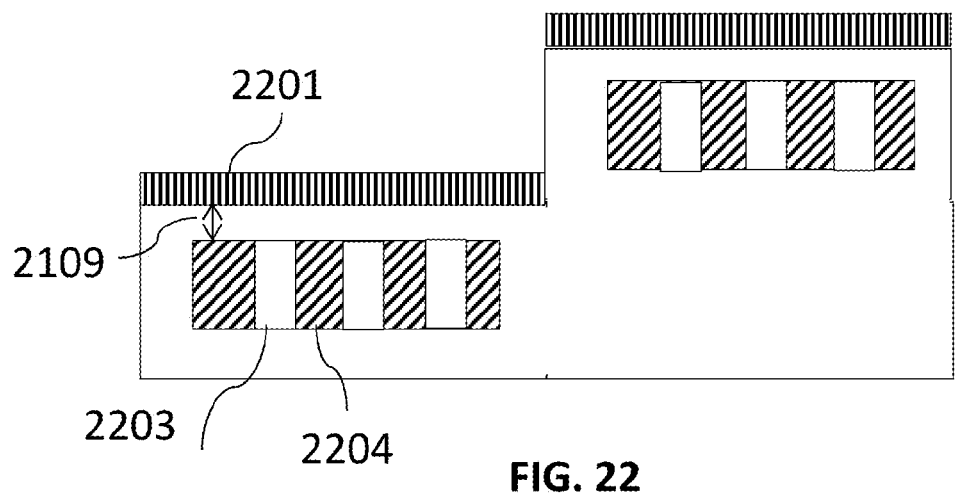

FIG. 22 shows a cross section of the channel under the patch or layer of conductive material, identified as 2201. This part of the channel has the microchannels 2204 formed by fins 2203 that are attached to the upper surface of the platform.

Figure 23:
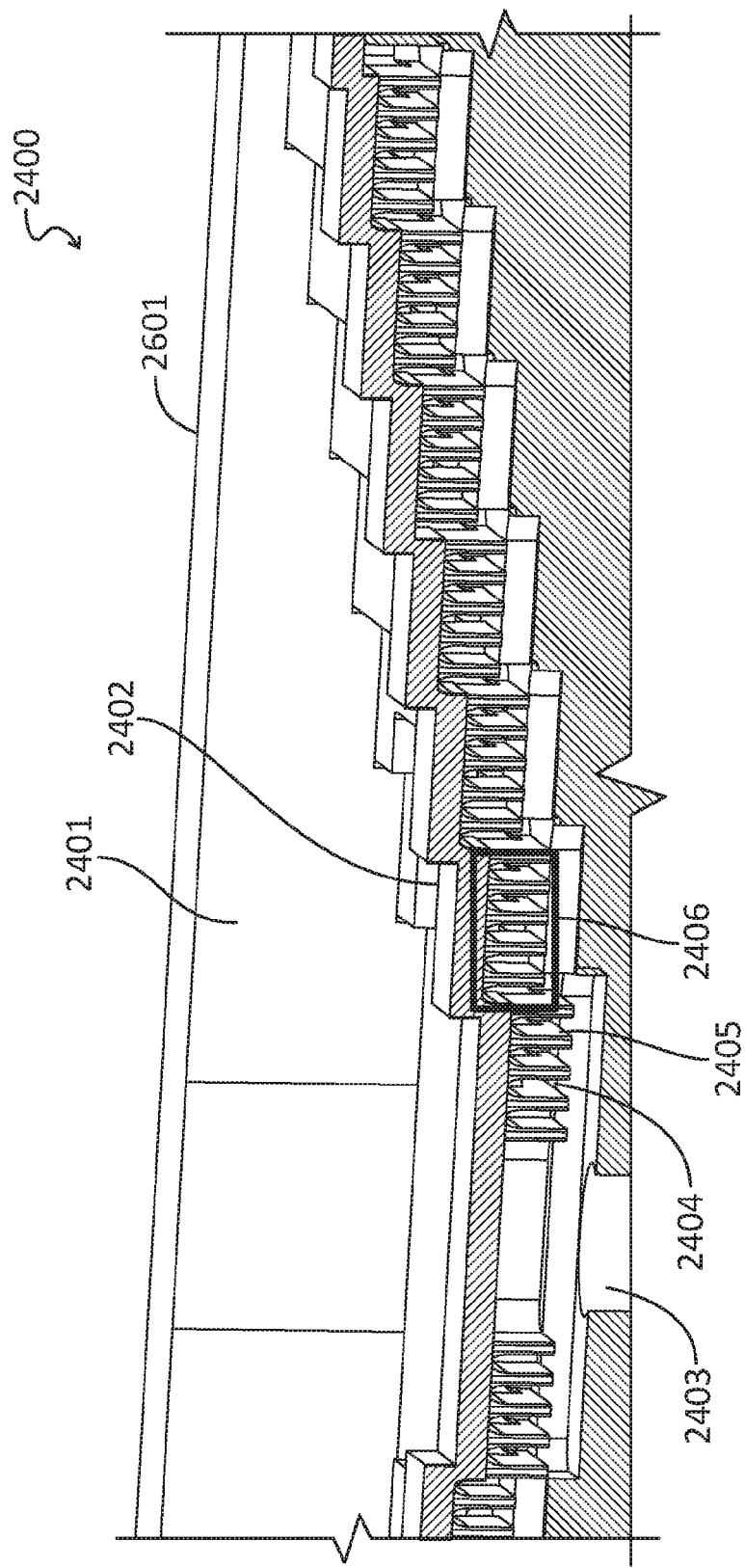
FIG. 23 is three dimensional drawing showing the walls in the cooling channels in accordance with an aspect of the invention.

The channel structure is further illustrated in a 3D drawing in FIG. 23. It shows the staggered or stepped structure of a manifold 2601 of laser module 2400 with a topside 2401 in which a platform with a patch of conductive material 2402 is identified, and with a channel 2406 going through the platform. Also identified is a fin or ridge 2405 and a microchannel 2404. Also identified is inlet 2403.

As an exemplary embodiment of the present invention a stepped laser assembly module has been provided wherein two sets of stepped and parallel platforms are present with each set of platforms sloping in opposing directions, as for instance illustrated in FIGS. 3 and 4. However, other stepped platforms configurations with cooling channels as described herein are possible and are fully contemplated. One other embodiment of the present invention of a laser module body with stepped platforms is illustrated in FIG. 24. The laser module 2500 hosts 8 laser sources and combines and outputs the combined radiation 2509 through an output hole or opening 2511. The module 2500 is based on a body 2510, which is preferably a single body with cooling channels, more preferably a ceramic single body. The body 2510 has a base plane that is parallel to a plane defined by the top edges of the walls of body 2510.

The laser body 2510 has platforms 2505, 2506, 2507, 2508, and opposing platforms at different heights of which only platform 2525 is just visible. The other platforms at the right side of the module are not visible in the view of FIG. 24. However, one can infer from the optical arrangement 2512 that laser sources are also available at the right side of the module. All platforms have different heights relative to the base plane and are arranged in two groups 2505 to 2508 on the left side and a group of platforms including 2525 on the right side. Each platform in this embodiment hosts one laser source, which are not identified in the drawing as to not to obscure other details, and the laser sources of each group are arranged such that the facets of each laser source are all in one plane but at different heights. The laser diodes radiate towards each other in a direction of a length of a platform. The radiation is interleaved by optics 2512 which directs the radiation 2509 towards the opening 2511. Radiation 2509 is drawn as layered radiation, indicating the staggered or stepped position of the laser diodes. Each laser diode is fixed to a platform The laser sources are mounted to the platforms either by soldering requiring respective metallization layers or are bolted/glued to the base. The electrical contacting in series of the individual lasers sources is performed via wirebonding or clamping current contacts or any other method known to a person skilled in the arts The platforms have embedded the cooling channels as described earlier and the input and output manifolds as described earlier to be connected to cooling fluid fittings 2503 and 2504. The electrical connectors 2501 and 2502 and the fluid fittings 2503 and 2504 may be attached after the body 2510 has been manufactured. However, openings and features to receive the electrodes and fluid connectors can already bee included in the body.

In one embodiment of the present invention the input manifold is positioned at both sides of the body, to make sure that the coolest fluid goes to the parts of the platform that host a laser diode. The output manifold in that embodiment is connected to the middle of the platforms to collect the cooling fluid with waste heat from the laser diodes and the optics which are heated by the radiation. These and other embodiments of a single body for a laser module are fully contemplated.

The term laser source is used herein. A laser source is a source of laser radiation and is intended to mean a single laser diode or, where appropriate, a laser diode bar.

It has been explained earlier above that different optical designs of the laser modules are applied in different embodiments of the present invention. The different designs have the cooling channel structure through stacked platforms in common. However, the total number of platforms in a laser module, the total number of laser sources applied and thus the total optical output power may vary, depending on the optical architecture of the embodiment. In one embodiment of the present invention the optical output is a beam of stacked laser beams. In an embodiment of the present invention, the optical output power of a laser module cooled in accordance with an aspect of the present invention is at least 100 Watt. In an embodiment of the present invention, the optical output power of a laser module cooled in accordance with an aspect of the present invention is at least 200 Watt. In an embodiment of the present invention, the optical output power of a laser module cooled in accordance with an aspect of the present invention is at least 300 Watt. In an embodiment of the present invention, the optical output power of a laser module cooled in accordance with an aspect of the present invention is at least 500 Watt. In an embodiment of the present invention, the optical output power of a laser module cooled in accordance with an aspect of the present invention is at least 1 kW.

While there have been shown, described and pointed out fundamental novel features of the invention as applied to preferred embodiments thereof, it will be understood that various omissions and substitutions and changes in the form and details of the methods and systems illustrated and in its operation may be made by those skilled in the art without departing from the spirit of the invention. It is the intention, therefore, to be limited only as indicated by the scope of the claims.

The invention claimed is:

1. A laser module body to be cooled with cooling fluid having a first and a second electrode, comprising:
   a unitary ceramic base having a bottom;
   a plurality of platforms formed in the unitary ceramic base, each one of the plurality of platforms having a width, a length and a height relative to a base plane parallel to the platforms and forming a stepped structure, each platform having a different height relative to the base plane;

each platform having a top surface being enabled to hold a laser source and at least one optical component at defined locations on a top surface of the platform;

each one of the plurality of ceramic platforms containing a cooling channel running internally along at least part of its length from a first end to a second end at a defined depth under the top surface at least under the defined locations, wherein the cooling channels in the platforms are spatially separated from each other;

a fluid inlet and an input manifold connecting the fluid inlet to the first end of each of the cooling channels of the plurality of ceramic platforms to distribute the cooling fluid; and an output manifold connecting the cooling channels from the second end of each of the cooling channels in the plurality of platforms to a fluid outlet that disperses the cooling fluid from the laser module body.

2. The laser module body of claim 1, wherein, the platforms are substantially parallel to each other.

3. The laser module body of claim 1, wherein each platform is provided with a conducting layer, to electrically connect the individual laser sources.

4. The laser module body of claim 1, wherein each platform is provided with a metallization layer for soldering the individual laser sources onto the platforms.

5. The laser module body of claim 1, wherein the cooling channels further comprise microchannels located underneath the laser source on at least one of the plurality of platforms.

6. The laser module body of claim 1, wherein there are at least two platforms.

7. The laser module body of claim 1, further comprising: a first and second receiving opening to receive the first and second electrodes.

8. The laser module body of claim 1, wherein the plurality of platforms includes a first and a second plurality of platforms, the first plurality of platforms having a sloping direction different from the second plurality of platforms.

9. The laser module body of claim 1, wherein the plurality of platforms includes a first and a second plurality of platforms, the first plurality of platforms having a same sloping direction as the second plurality of platforms.

10. The laser module body of claim 1, wherein the laser module body has a radiation output to provide stacked radiation beams generated by laser sources hosted on the plurality of platforms.

11. A method for cooling a laser module body having a first and a second electrode and a plurality of laser sources, with a cooling fluid, comprising:

providing the cooling fluid on an inlet of the laser module body, the laser module being a single body of ceramic material;

distributing the cooling fluid through an input manifold connected to the inlet to a first end of each of a plurality of cooling channels, each of the cooling channels being embedded at a predefined depth in a corresponding ceramic platform in a plurality of ceramic platforms in the single body, the ceramic platforms being substantially parallel to each other, each one of the plurality of ceramic platforms having a height relative to a base plane of the single body parallel to the ceramic platforms to form a stepped structure, each cooling channel inside a ceramic platform running from the first end of the ceramic platform to a second end of the ceramic platform, each ceramic platform having a different height relative to each other measured to the base plane, a top surface of each ceramic platform supporting one of the plurality of laser sources and at least one optical component at defined locations, the cooling channels in the ceramic platforms being spatially separated from each other, each ceramic platform being adapted to host a laser source; and receiving with an output manifold cooling fluid exiting the cooling channels from the second end and disposing the cooling fluid on an outlet connected to the output manifold.

12. The method of claim 11, further comprising, the cooling fluid passing through a plurality of micro channels in the cooling channel of each of the plurality of ceramic platforms and removing heat generated by the laser source on the at least one of the plurality of ceramic platforms.

13. The method of claim 12, wherein the microchannels are located underneath the laser source.

14. The method of claim 11, wherein there are at least two ceramic platforms.

15. The method of claim 11, wherein the plurality of ceramic platforms includes a first and a second plurality of ceramic platforms, the first plurality of ceramic platforms having a sloping direction that is different from the second plurality of ceramic platforms.

16. The method of claim 11, wherein the plurality of ceramic platforms includes a first and a second plurality of ceramic platforms, the first plurality of ceramic platforms having a same sloping direction as the second plurality of ceramic platforms.

17. The method of claim 11, further comprising: outputting stacked radiation beams generated by laser sources hosted on the plurality of platforms.

18. The method of claim 11, wherein the cooling channels are an integrated part of the single body that are formed during manufacturing of the single body.

* * * * *